(12) United States Patent
Kim et al.

(10) Patent No.: US 8,796,861 B2
(45) Date of Patent: Aug. 5, 2014

(54) SEMICONDUCTOR PACKAGE HAVING SUPPORT MEMBER

(75) Inventors: Hyun-jin Kim, Suwon-si (KR); Jong-keun Ahn, Yongin-si (KR); Sun-Pil Youn, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/602,811

(22) Filed: Sep. 4, 2012

(65) Prior Publication Data

US 2013/0056882 A1    Mar. 7, 2013

(30) Foreign Application Priority Data

Sep. 6, 2011    (KR) .................. 10-2011-0090196

(51) Int. Cl.
  *H01L 23/52*    (2006.01)
  *H01L 23/48*    (2006.01)
  *H01L 25/065*   (2006.01)
  *H01L 27/146*   (2006.01)

(52) U.S. Cl.
  USPC .............. 257/777; 257/784; 257/E25.013; 257/E27.137

(58) Field of Classification Search
  USPC ............. 257/777, 784, E25.013, E27.137
  See application file for complete search history.

(56) References Cited

U.S. PATENT DOCUMENTS

| | | | |
|---|---|---|---|
| 7,989,941 B2* | 8/2011 | Chin et al. | 257/686 |
| 8,399,992 B2* | 3/2013 | Park et al. | 257/777 |
| 2009/0085223 A1* | 4/2009 | Nishiyama et al. | 257/777 |
| 2009/0140440 A1* | 6/2009 | Liu et al. | 257/777 |
| 2009/0273096 A1* | 11/2009 | Hiew et al. | 257/777 |
| 2010/0244217 A1* | 9/2010 | Ha et al. | 257/686 |

FOREIGN PATENT DOCUMENTS

| | | |
|---|---|---|
| JP | 2009-212486 A | 9/2009 |
| KR | 10-0914552 B1 | 1/2007 |
| KR | 20100134354 A | 12/2010 |

* cited by examiner

*Primary Examiner* — Luan C Thai

(74) *Attorney, Agent, or Firm* — Harness, Dickey & Pierce, P.L.C.

(57) ABSTRACT

Semiconductor packages including a substrate, a plurality of first semiconductor chips stacked on the substrate, a second semiconductor chip interposed between the substrate and a lowermost semiconductor chip among the first semiconductor chips, and a supporting member disposed between the substrate and the lowermost semiconductor chip among the first semiconductor chips to support the first semiconductor chips, may be provided. The supporting member may include a passive element such as a capacitor, a resistor, or an inductor. By including the supporting member, the semiconductor packages may achieve a smaller planar size and have an improved tolerance for subsequent interconnections.

20 Claims, 21 Drawing Sheets

SEMICONDUCTOR PACKAGE HAVING SUPPORT MEMBER

CROSS-REFERENCE TO RELATED APPLICATIONS

This application claims priority under 35 U.S.C. §119 to Korean Patent Application No. 10-2011-0090196, filed on Sep. 6, 2011, in the Korean Intellectual Property Office, the disclosure of which is incorporated herein in its entirety by reference.

BACKGROUND

The inventive concepts relate to a semiconductor package, and more particularly, to a semiconductor package that includes a supporting member.

Semiconductor products have small sizes but are required to process mass data. Accordingly, a stack-type semiconductor package, which is a package manufactured by stacking a plurality of semiconductor chips on each other, has been suggested. However, as the number of stacked semiconductor chips and electrode pads formed on the semiconductor chips increases, it is difficult to connect the semiconductor chips to each other or a semiconductor chip to a substrate on which interconnection lines of the stack-type semiconductor package are formed, and it is also difficult to reduce a planar size of the semiconductor package.

SUMMARY

According to example embodiments of the inventive concepts, a semiconductor package may include a substrate, a plurality of first semiconductor chips stacked on the substrate, a second semiconductor chip interposed between the substrate and a lowermost semiconductor chip among the first semiconductor chips, and a supporting member disposed between the substrate and the lowermost semiconductor chip among the first semiconductor chips. The support member may be configured to support the first semiconductor chips and may include a passive element.

A planar size of the supporting member may be smaller than planar sizes of the first semiconductor chips.

The supporting member may be entirely covered by a lower surface of the lowermost semiconductor chip.

A sidewall of the supporting member may be disposed flush or offset inwards with respect to a sidewall of the lowermost semiconductor chip.

A sidewall of the supporting member may protrudes from a sidewall of the lowermost semiconductor chip.

The supporting member may be electrically connected to the substrate.

The supporting member may include a plurality of supporting member segments spaced apart from each other and surrounding the second semiconductor chip.

The supporting member may surround the second semiconductor chip on at least three sides thereof.

The supporting member may receive power from the second semiconductor chip and may be grounded through the second semiconductor chip.

The supporting member may receive power by the second semiconductor chip and may be grounded through the substrate.

According to an example embodiment of the inventive concepts, the supporting member may include a planar capacitor structure that comprises a first electrode, a dielectric layer, and a second electrode that are vertically aligned.

The supporting member may include a finger-shape capacitor structure having a first electrode, a dielectric layer, and a second electrode, in which the first electrode, a dielectric layer, and a second electrode are laterally aligned.

The supporting member may include a finger-shape capacitor structure having a first electrode, a dielectric layer, and a second electrode, in which the first electrode, a dielectric layer, and a second electrode are vertically aligned.

The supporting member may include at least one selected from the group consisting of a capacitor, an inductor, and a resistor.

According to example embodiments of the inventive concepts, a semiconductor package may include a substrate, a first semiconductor chip on the substrate, a second semiconductor chip interposed between a substrate and the first semiconductor chip, and a supporting member disposed between the substrate and the first semiconductor chip to support the first semiconductor chip. The supporting member may be disposed at a same level as the second semiconductor chip and the supporting member may include a passive element.

According to example embodiments of the inventive concepts, a semiconductor package may include a substrate, at least one first semiconductor chip stacked on the substrate, a supporting member between the substrate and the lowermost semiconductor chip among the at least one first semiconductor chip or between vertically adjacent semiconductor chips among the at least one first semiconductor chip. The supporting member may be configured to support the first semiconductor chips and include a passive element. A second semiconductor chip may be at a same level with the supporting member.

The substrate may have a recess to accommodate the supporting member therein.

A footprint defined by the supporting member may be within a footprint defined by the at least one first semiconductor chips.

A footprint defined by both the supporting member and the second semiconductor chip may be within a footprint defined by the at least one first semiconductor chips.

BRIEF DESCRIPTION OF THE DRAWINGS

Example embodiments of the inventive concepts will be more clearly understood from the following detailed description taken in conjunction with the accompanying drawings in which.

Figure 1:
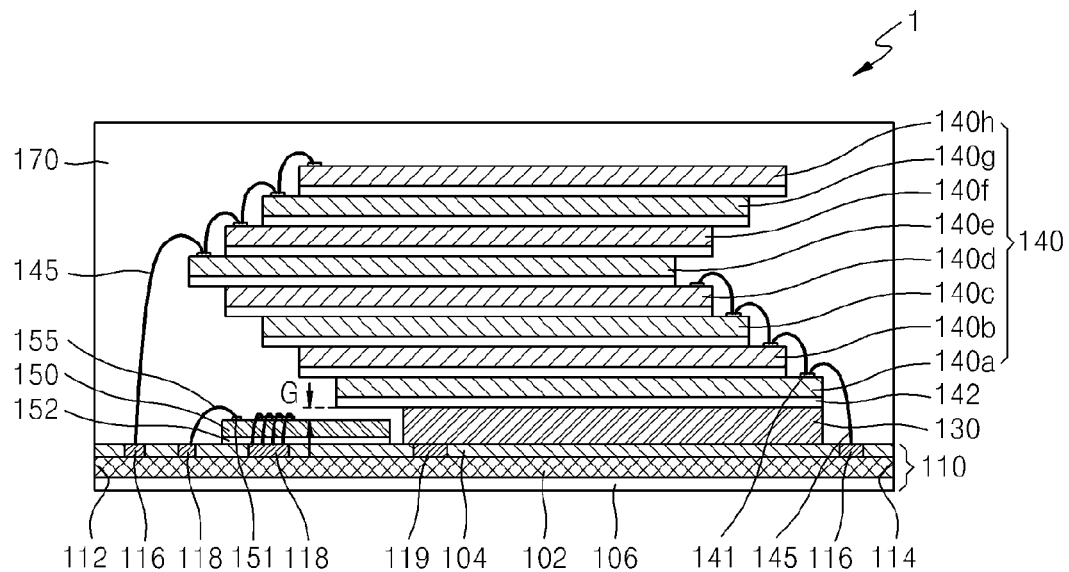
FIG. 1 is a schematic cross-sectional view of a semiconductor package according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items.

The present application is related to the co-pending and commonly-assigned U.S. Ser. No. 12/776,789 application entitled, "SEMICONDUCTOR PACKAGE, STACK MODULE, CARD, AND ELECTRONIC SYSTEM", which was invented by Keun-ho Choi, Myung-kee Chung, Kil-soo Kim, and Kun-dae Yeom and filed on May 10, 2010, by Samsung Electronics Co., Ltd., and claims the benefit of Korean Patent Application No. 10-2009-0052942, which is entitled, "SEMICONDUCTOR PACKAGE, STACK MODULE, CARD, AND ELECTRONIC SYSTEM", invented by Keun-ho Choi, Myung-kee Chung, Kil-soo Kim, and Kun-dae Yeom, and was filed on Jun. 15, 2009, by Samsung Electronics Co., Ltd. The above applications are all incorporated herein in their entirety by reference.

Figure 2:
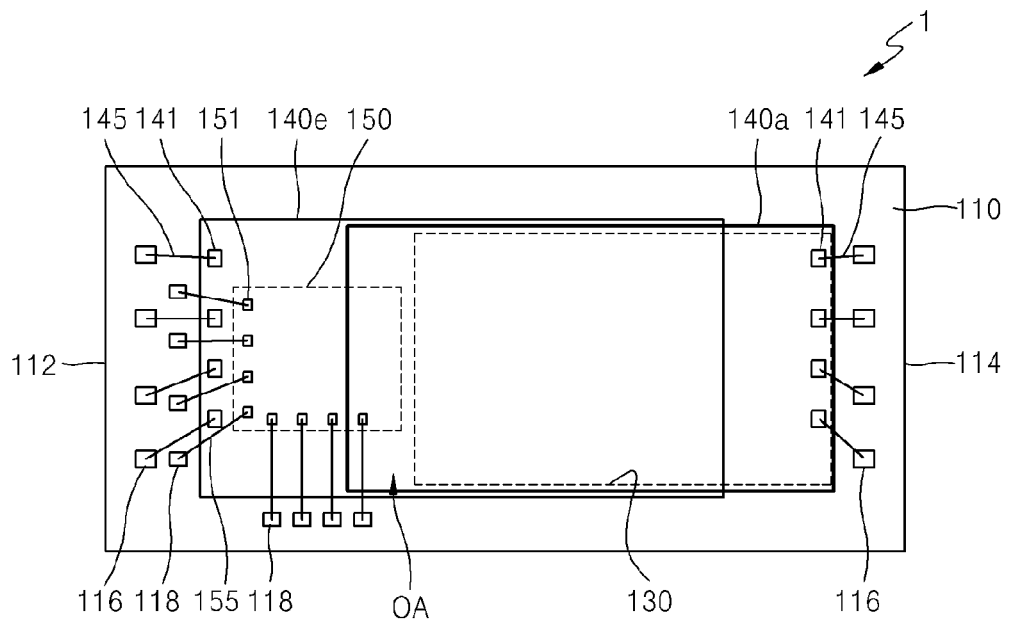
FIG. 2 is a schematic top view of the semiconductor package of FIG. 1.

FIG. 1 is a schematic cross-sectional view of a semiconductor package 1 according to an example embodiment of the inventive concepts. FIG. 2 is a schematic top view of the semiconductor package 1 of FIG. 1.

Referring to FIGS. 1 and 2, the semiconductor package 1 may include a substrate 110, first semiconductor chips 140, a second semiconductor chip 150, and a supporting member 130.

The substrate 110 may include, for example, a printed circuit board, a flexible substrate, or a tape substrate. The substrate 110 may include a core board 102, a first resin layer 104 disposed on an upper surface of the core board 102, and a second resin layer 106 disposed on a lower surface of the core board 102. The substrate 110 may include a first sidewall 112 and a second sidewall 114, which are disposed on opposite sides of the substrate 110.

The first resin layer 104 may have first electrode fingers 116, second electrode fingers 118, and third electrode fingers 119. For example, the first electrode fingers 116, the second electrode fingers 118, and the third electrode fingers 119 may be exposed by the first resin layer 104 disposed on the core board 102. The substrate 110 may further include circuit patterns (not shown), and some of the first electrode fingers 116, some of the second electrode fingers 118, and some of the third electrode fingers 119 may be electrically connected to each other by the circuit patterns. The number and locations of the first electrode fingers 116, the second electrode fingers 118, and the third electrode fingers 119 are exemplarily illustrated, and thus, the scope of example embodiments are not limited thereto.

Each of the first semiconductor chips 140 may be stacked on each other on the substrate 110 by using adhesion members 142. Each of the first semiconductor chips 140 may include an integrated circuit therein. For example, the integrated circuit may include a memory circuit or a logic circuit. The first semiconductor chips 140 may include first electrode pads 141 connected to the integrated circuit included therein on upper surfaces of the first semiconductor chips 140 (for example, an active surface).

Each of the first semiconductor chips 140 may be identical or different products. For example, each of the first semiconductor chips 140 may be a memory chip. The memory chip may be selected from a variety of memory circuits, and may include, for example, DRAM, SRAM, flash memory, PRAM, ReRAM, FeRAM, or MRAM. The first semiconductor chips 140 may have identical or different sizes according to the type of memory circuit used. The number of first semiconductor chips 140 is exemplarily illustrated, and thus, the scope of example embodiments is not limited thereto.

Each of the first semiconductor chips 140 may be disposed in a sequentially offset manner, exposing the first electrode pads 141. For example, first semiconductor chips 140a, 140b, 140c, 140d, and 140e are disposed sequentially offset toward the first sidewall 112 of the substrate 110, and first semiconductor chips 140f, 140g, and 140h are disposed sequentially offset toward the second sidewall 114 of the substrate 110. The offset of the first semiconductor chips 140 is exemplarily illustrated, and thus, the scope of example embodiments is not limited thereto. For example, the first semiconductor chips 140 may be disposed offset in one direction, or may be alternatively offset in the two directions described above.

The first semiconductor chips 140 may be electrically connected to the substrate 110 through first connecting members 145. For example, the first connecting members 145 may be a bonding wire. For example, the first connecting member 145 may directly electrically connect the first electrode finger 116 of the substrate 110 to the first electrode pad 141 of the first semiconductor chip 140a. Also, the first connecting members 145 may electrically connect the first electrode pads 141 of the first semiconductor chips 140a, 140b, 140c, and 140d with each other. Thus, through the first connecting members 145, the first semiconductor chips 140a, 140b, 140c, and 140d may be electrically connected to the substrate 110. Also, the first connecting member 145 may directly electrically connect the first electrode finger 116 of the substrate 110 to the first electrode pad 141 of the first semiconductor chip 140e. Also, the first connecting members 145 may electrically connect the first electrode pads 141 of the first semiconductor chips 140e, 140f, 140g, and 140h with each other. Thus, through the first connecting members 145, the first semiconductor chips 140e, 140f, 140g, and 140h may be electrically connected to the substrate 110.

The supporting member 130 may support the first semiconductor chips 140. The supporting member 130 may be disposed between the substrate 110 and the first semiconductor chips 140. For example, the supporting member 130 may be disposed between the substrate 110 and the first semiconductor chip 140a, which is the lowermost semiconductor chip among the first semiconductor chips 140. The supporting member 130 may be adhered onto the substrate 110 by using an adhesion member (not shown).

The supporting member 130 may include a passive element therein, and examples of the supporting member 130 may include a capacitor, a resistor, and an inductor. The supporting member 130 may provide a variety of functions, e.g., decoupling, filtering, resonance damping, and/or voltage regulation. If the supporting member 130 is a capacitor, decoupling and/or filtering functions may be provided. Because the capacitor reduces impedance between the supporting member 130 and the first semiconductor chips 140 to a very low level, the capacitor may provide an improved performance than a capacitor disposed outside. If the supporting member 130 is an inductor, the supporting member 130 may be useful for radio frequency (RF) applications, for example, wireless communication, or power delivery applications. If the supporting member 130 is an inductor, the supporting member 130 may be useful for reduction in resonance due to package inductance and on-die capacitance. Various examples of the supporting member 130 will be described with reference to FIGS. 24 to 32 below.

The supporting member 130 may be electrically connected to the substrate 110 through the third electrode fingers 119, and may be electrically connected to the second semiconductor chip 150 through the substrate 110. The supporting member 130 may be electrically insulated from the first semiconductor chips 140. However, the inventive concepts are not limited thereto, and are also applicable to example embodiments in which the supporting member 130 is electrically connected to the first semiconductor chips 140.

The supporting member 130 may be disposed offset inwards from at least one sidewall of the first semiconductor chip 140a. For example, the supporting member 130 may be disposed offset inwards from at least one sidewall of the first semiconductor chip 140a near the first sidewall 112. Thus, a lower surface of the first semiconductor chip 140a, for example, a portion of a non-active surface, may be exposed from the supporting member 130 and an offset region (OA) may be limited in correspondence to the exposed portion of the first semiconductor chip 140a. To prevent or reduce an increase in the size of the semiconductor package 1 due to the supporting member 130, a planar size of the supporting member 130 may be smaller than a planar size of the first semiconductor chip 140a. In this regard, the term 'planar size' refers to a size of an object on the substrate 110 when seen from above, for example, a size of a horizontal cross-section parallel to the upper surface of substrate 110. In other example embodiments of the inventive concepts, however, the planar size may instead refer to a footprint, meaning an area affected or covered by an object.

Other sidewalls of the supporting member 130 may be arranged flush with corresponding sidewalls of the first semiconductor chip 140a, or disposed offset inwards. For example, an upper surface of the supporting member 130 may be entirely covered by the lower surface of the first semiconductor chip 140a. For example, the supporting member 130 may entirely overlap vertically with a portion of the first semiconductor chip 140a. When seeing the substrate 110 from above, the supporting member 130 is covered by the first semiconductor chip 140a and thus is not visible. Accordingly, the supporting member 130 may affect only the height of the semiconductor package 1 and may not substantially affect the planar size of the semiconductor package 1.

The second semiconductor chip 150 may be disposed onto the substrate 110 by using an adhesion member 152. The second semiconductor chip 150 may include an integrated circuit therein. For example, the second semiconductor chip 150 may be a logic chip including a logic circuit. The logic chip may be a controller for controlling memory chips. The second semiconductor chip 150 may include second electrode pads 151 electrically connected to the integrated circuit inside thereof, the second semiconductor chip 150 may have a smaller planar size than that of the first semiconductor chips 140. Accordingly, the second electrode pads 151 may be more densely arranged than the first electrode pads 141. Furthermore, the more complicated function the second semiconductor chip 150 has, the denser arrangement the second electrode pads 151 may have.

The second semiconductor chip 150 may be disposed under the first semiconductor chip 140a at substantially the same level as the supporting member 130. For example, the second semiconductor chip 150 may be disposed adjacent to the supporting member 130 in the offset region OA under the first semiconductor chip 140a. Thus, at least a portion of the second semiconductor chip 150 may vertically overlap with a portion of the first semiconductor chip 140a. The planar size and an offset degree of the supporting member 130 may be controlled to control an overlap degree between the second semiconductor chip 150 and the first semiconductor chip 140a. This overlap arrangement may reduce or minimize an effect of a planar size of the second semiconductor chip 150 on the planar size of the semiconductor package 1.

The second semiconductor chip 150 may entirely overlap vertically with the first semiconductor chip 140e which is offset farthest toward the first sidewall 112 of the substrate 110. When seeing the substrate 110 from above, the second semiconductor chip 150 is substantially hidden by the first semiconductor chips 140. Thus, the second semiconductor chip 150 may not increase the planar size of the semiconductor package 1.

However, according to a modified example of this embodiment, the second semiconductor chip 150 may not be entirely covered with the first semiconductor chip 140e. A protruding part of the second semiconductor chip 150 may be reduced or minimized to reduce or minimize its effect on an increase in the planar size of the semiconductor package 1.

The second semiconductor chip 150 may be electrically connected to the substrate 110 through second connecting members 155. For example, the second connecting members 155 may be bonding wires. For example, the second connecting members 155 may directly electrically connect the second electrode fingers 118 of the substrate 110 to the second electrode pads 151 of the second semiconductor chip 150. A height of the supporting member 130 from the substrate 110 may be higher than a height of the second semiconductor chip 150 from the substrate 110 to easily arrange the second connecting members 155. Thus, a gap G may be formed between the second semiconductor chip 150 and the first semiconductor chip 140a.

Some of the second electrode fingers 118 may be electrically connected to the first electrode fingers 116 through an internal circuit (not shown) of the substrate 110. Thus, the second semiconductor chip 150 may be electrically connected to the first semiconductor chips 140. Also, some of the second electrode fingers 118 may be electrically connected to the third electrode fingers 119 through an internal circuit (not shown) of the substrate 110. Thus, the second semiconductor chip 150 may be electrically connected to the supporting member 130.

A molding member 170 may be formed on the substrate 110 to cover the first semiconductor chips 140 and the second semiconductor chip 150. Also, the molding member 170 may cover the supporting member 130. For example, the molding member 170 may include an insulating resin, for example, an epoxy molding compound.

According to a example embodiment, the second semiconductor chip 150 is stacked directly on the substrate 110. Thus, heights and/or lengths of the second connecting members 155 are smaller than when the second semiconductor chip 150 is arranged above the first semiconductor chip 140h, which is the uppermost semiconductor chip among the first semiconductor chips 140. As a result, the second connecting members 155 may be easily connected to the second electrode pads 151 that are densely arranged. Because the heights and/or lengths of the second connecting members 155 are smaller, there is a lower probability that the second connecting members 155 will short circuit due to wire swiping in a subsequent molding.

Accordingly, the second semiconductor chip 150 arranged directly on the substrate 110 may improve connection reliability between the second semiconductor chip 150 and the substrate 110. Also, the second semiconductor chip 150 may overlap with a portion of the first semiconductor chips 140 and may prevent or reduce an increase of the footprint of the semiconductor package 1. As a result, the planar size of the semiconductor package 1 may be prevented or reduced.

FIGS. 3 to 7 are schematic cross-sectional views of semiconductor packages 1a, 1b, 1c, 1d, and 1e according to example embodiments of the inventive concepts. The semiconductor packages 1a, 1b, 1c, 1d, and 1e are formed by partially modifying the semiconductor package 1 of FIG. 1, and thus, repeated description will be omitted.

Figure 3:
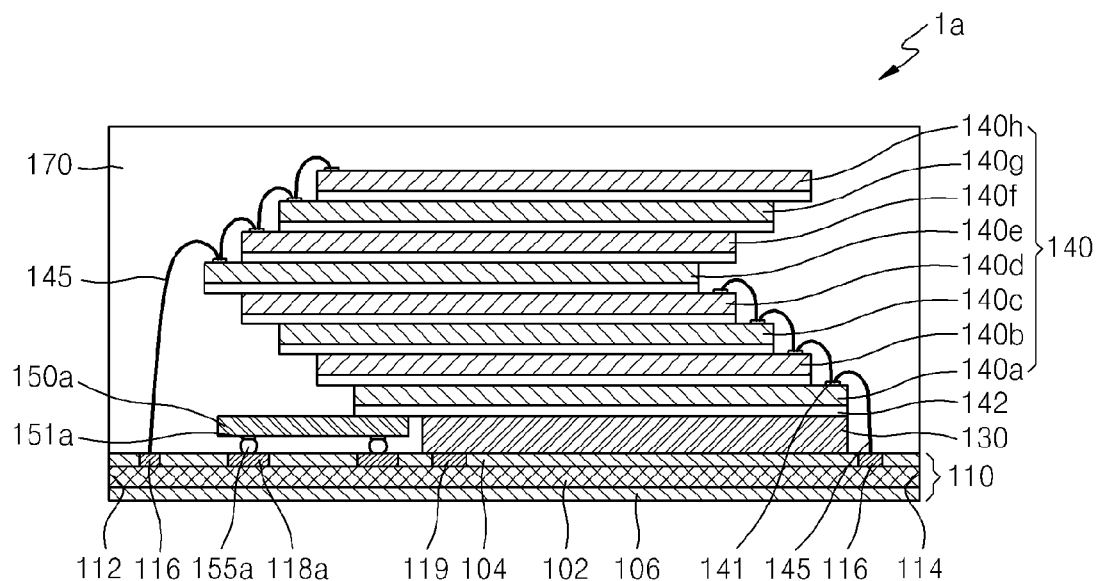
FIGS. 3 to 7 are schematic cross-sectional views of semiconductor packages according to example embodiments of the inventive concepts.

Referring to FIG. 3, the second semiconductor chip 150 may be of a flip chip type and may include a second semiconductor chip 150a stacked on the substrate 110. The second semiconductor chip 150a may be arranged such that an active surface of the second semiconductor chip 150a faces the substrate 110 and is connected to second bonding fingers 118a of the substrate 110 through second electrode pads 151a and bumps 155a. The bumps 155a may be, for example, solder balls.

Optionally, sizes of the bumps 155a may be controlled such that an upper portion of the second semiconductor chip 150a meets a lower portion of a first semiconductor chip 140a. Because both the supporting member 130 and the second semiconductor chip 150a support first semiconductor chips 140, the solidity of the semiconductor package 1a may be increased. The upper portion of the second semiconductor chip 150a may be adhered onto the lower portion of the first semiconductor chip 140a by using an adhesion member 142. Alternatively, a spatial gap as described above may be present between the second semiconductor chip 150a and the first semiconductor chip 140a.

Figure 4:
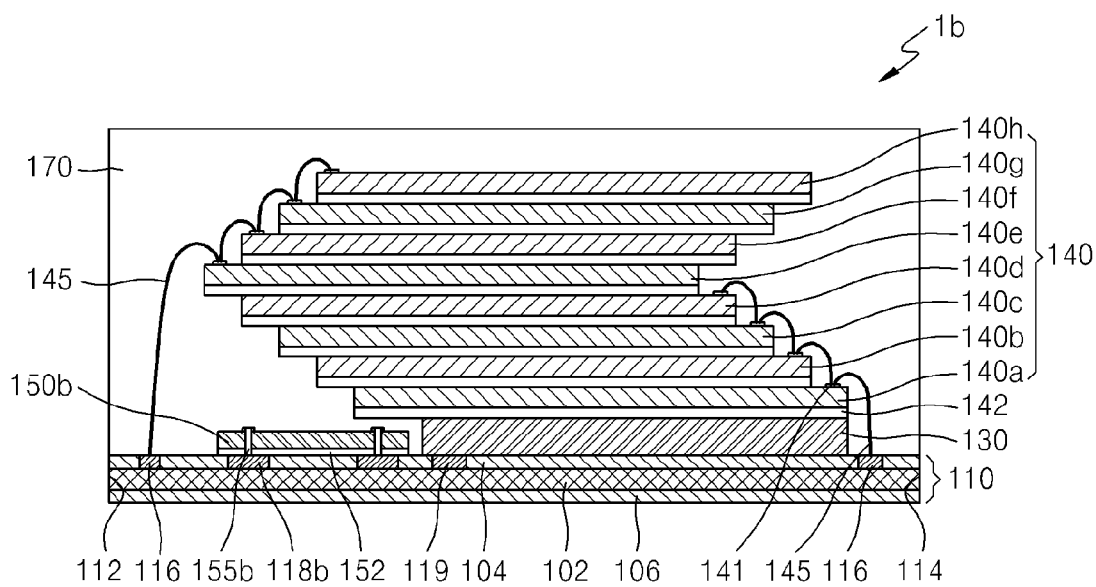

Referring to FIG. 4, the semiconductor package 1b may include a second semiconductor chip 150b. The second semiconductor chip 150b may be electrically connected to second bonding fingers 118b of the substrate 110 through a second connecting member 155b passing through the second semiconductor chip 150b. The second connecting member 155b may also be referred to as a through-silicon via (TSV).

Figure 5:
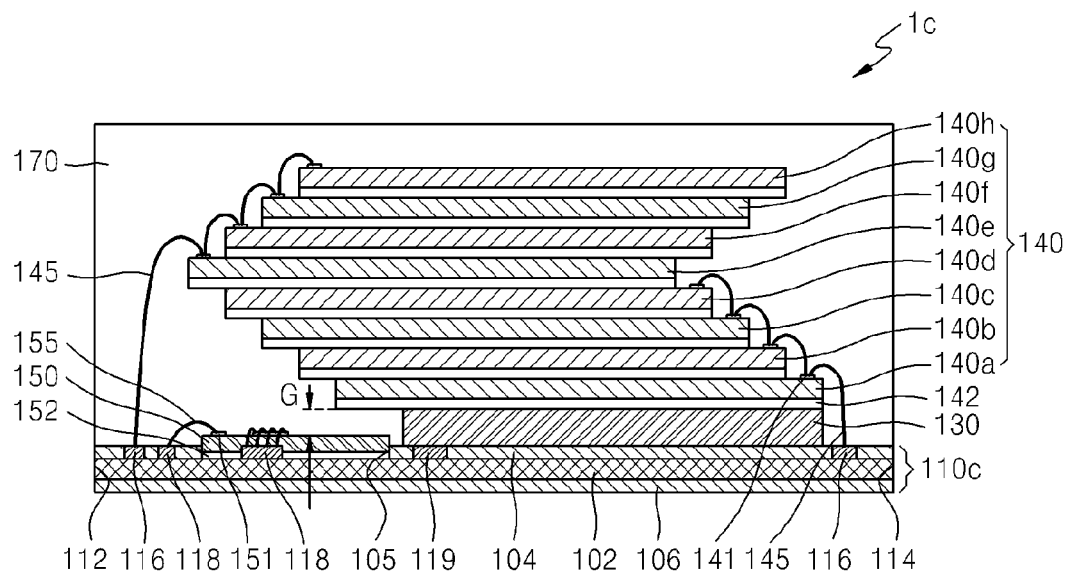

Referring to FIG. 5, the semiconductor package 1c may include a substrate 110c. The substrate 110c may include a recess region 105 in the first resin layer 104. The second semiconductor chip 150 may be disposed in the recess region 105 of the core board 102 by using the adhesion member 152. Accordingly, the second semiconductor chip 150 may be disposed at a lower level than the supporting member 130. A spatial gap G formed between the second semiconductor chip 150 and a first semiconductor chip 140a is greater than the spatial gap formed between the second semiconductor chip 150 and the first semiconductor chip 140a shown in FIG. 1. As a result, the second connecting members 155 may be more easily formed than in the semiconductor package 1 of FIG. 1.

Figure 6:
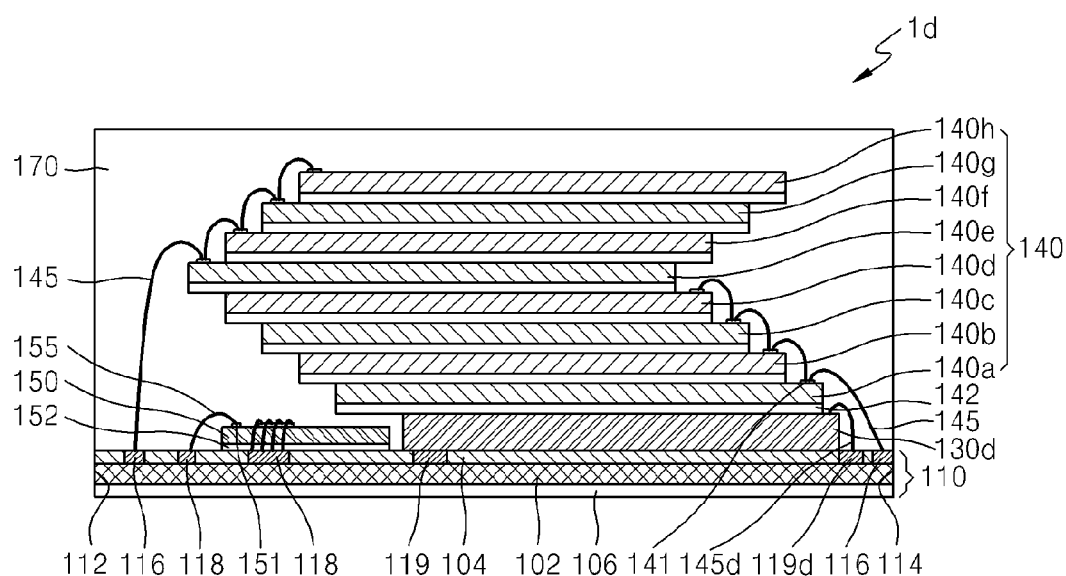

Referring to FIG. 6, the semiconductor package 1d may include a supporting member 130d. The supporting member 130d may be disposed offset inwards from at least one sidewall of the first semiconductor chip 140a. For example, the supporting member 130d may be disposed offset inwards from at least one sidewall of the first semiconductor chip 140a near the first sidewall 112. Also, at least one of other sidewalls of the supporting member 130d may be disposed protruding from corresponding sidewalls of the first semiconductor chip 140a. For example, the supporting member 130d may be disposed protruding from at least one sidewall of the first semiconductor chip 140a near the second sidewall 114. The supporting member 130d may be electrically connected to the substrate 110 through the third electrode fingers 119. Also, the supporting member 130d may be electrically connected to the fourth electrode fingers 119d of the substrate 110 through a supporting member connection member 145d, e.g., a bonding wire.

Figure 7:
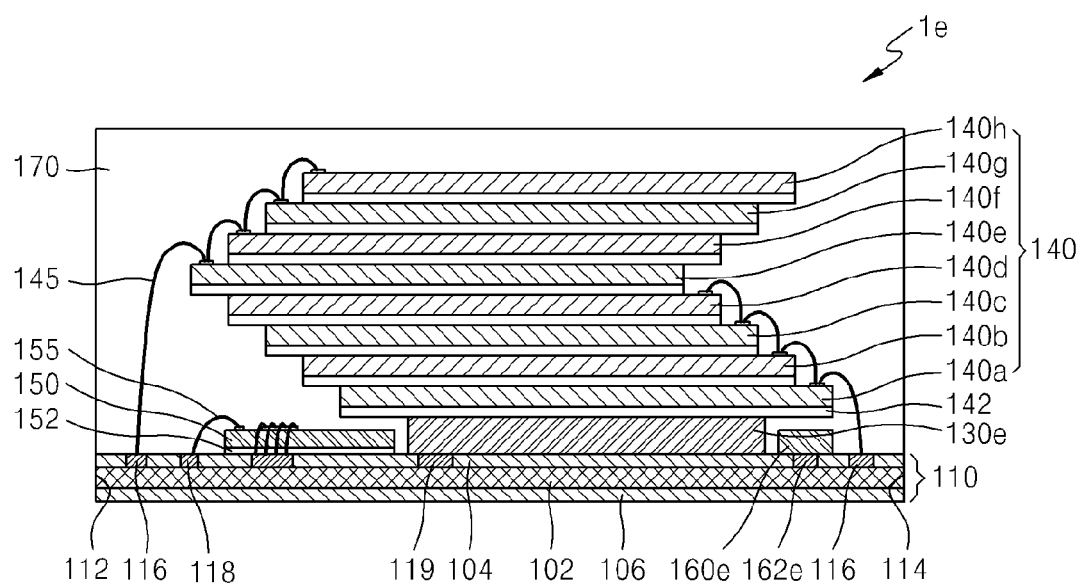

Referring to FIG. 7, the semiconductor package 1e may include a supporting member 130e. The supporting member 130e may be disposed offset inwards from at least one sidewall of the first semiconductor chip 140a. For example, the supporting member 130e may be disposed offset inwards from at least one sidewall of the first semiconductor chip 140a near the first sidewall 112. Also, at least one of other sidewalls of the supporting member 130e may be disposed offset inwards from corresponding sidewalls of the first semiconductor chip 140a. For example, the supporting member 130e may be disposed offset inwards from at least one sidewall of the first semiconductor chip 140a near the second sidewall 114. The supporting member 130e may be electrically connected to the substrate 110 through the third electrode fingers 119.

Also, the semiconductor package 1e may further include a passive element 160e disposed apart from the supporting member 130e on the substrate 110. The passive element 160e may include a capacitor, a resistor, or an inductor. At least a portion of the passive element 160e may vertically overlap with a portion of the first semiconductor chip 140a. Accordingly, when seeing the substrate 110 from above, the passive element 160e may be entirely covered by the first semiconductor chips 140. Thus, the passive element 160e does not affect a planar size of the semiconductor package 1e. The passive element 160e may be electrically connected to the substrate 110 through a passive element electrode finger 162e. Also, the locations of the passive element 160e and the second semiconductor chip 150 may be switchable.

Also, the technical features of the semiconductor packages 1c to 1e of FIGS. 5 to 7 may also be combined with the technical features of the semiconductor packages 1a and 1b of FIGS. 3 and 4. For example, the second semiconductor chip 150 may also be a flip chip, or the second connecting members 155 may also be a solder ball and/or a TSV.

Figure 8:
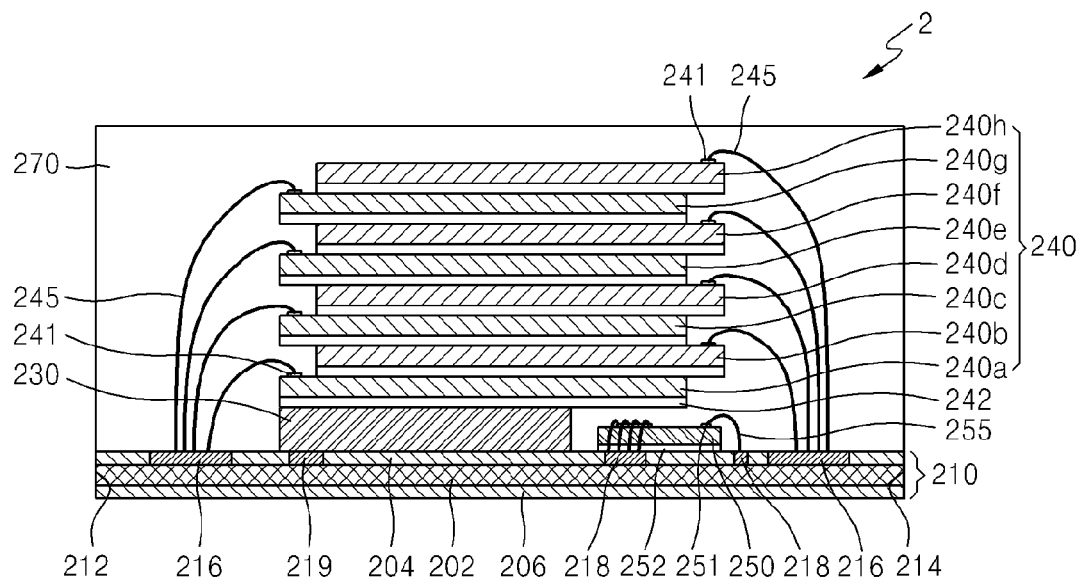
FIG. 8 is a schematic cross-sectional view of a semiconductor package according to an example embodiment of the inventive concepts.
Figure 9:
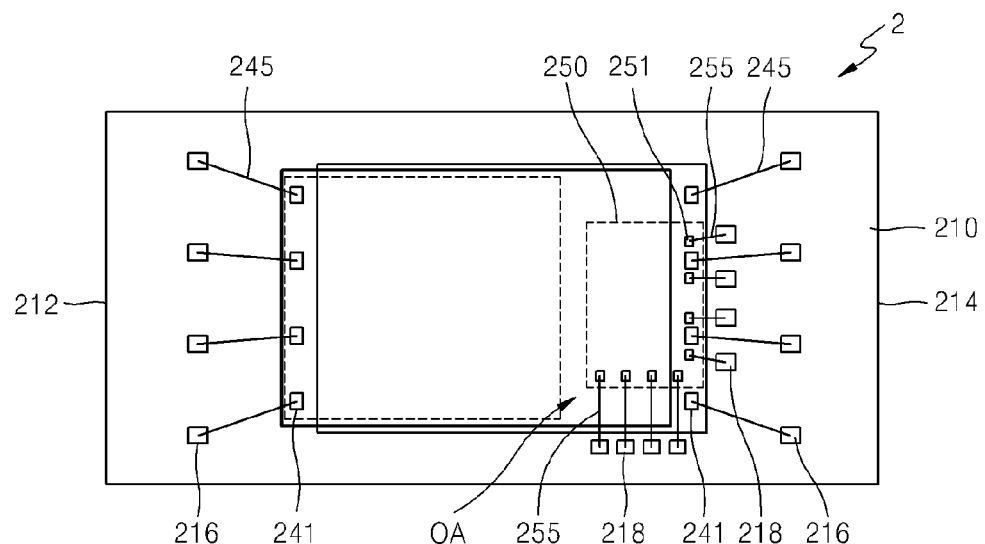
FIG. 9 is a schematic top view of the semiconductor package of FIG. 8.

FIG. 8 is a schematic cross-sectional view of a semiconductor package 2 according to an example embodiment of the inventive concepts. FIG. 9 is a schematic top view of the semiconductor package 2 of FIG. 8.

Referring to FIGS. 8 and 9, the semiconductor package 2 may include a substrate 210, first semiconductor chips 240, a second semiconductor chip 250, and a supporting member 230.

The substrate 210 may include, for example, a printed circuit board, a flexible substrate, or a tape substrate. The substrate 210 may include a core board 202, a first resin layer 204 disposed on an upper surface of the core board 202, and a second resin layer 206 disposed on a lower surface of the core board 202. The substrate 210 may include a first sidewall 212 and a second sidewall 214, which are disposed on opposite sides of the substrate 210. The first resin layer 204 may have first electrode fingers 216, second electrode fingers 218, and third electrode fingers 219. The description about the substrate 110 illustrated in FIG. 1A apply as the description about the substrate 210.

Each of the first semiconductor chips 240 may be stacked on each other on the substrate 210 by using adhesion members 242. Each of the first semiconductor chips 240 may include an integrated circuit, e.g., a memory circuit or a logic circuit. Unlike the corresponding structure of FIG. 1, each of the first semiconductor chips 240 may be disposed offset, for example, in a zigzag manner. Thus, first electrode pads 241 of first semiconductor chips 240a, 240c, 240e, and 240g may be disposed on edges of the first semiconductor chips 240a, 240c, 240e, and 240g near the first sidewall 212 of the substrate 210, and first electrode pads 241 of first semiconductor chips 240b, 240d, 240f, and 240h may be disposed on edges of the first semiconductor chips 240b, 240d, 240f, and 240h near the second sidewall 214 of the substrate 210.

The first semiconductor chips 240 may be electrically connected to the substrate 210 through first connecting members 245. For example, the first connecting members 245 may be bonding wires. For example, the first connecting members 245 may directly electrically connect the first electrode fingers 216 of the substrate 210 to the first electrode pads 241 of the first semiconductor chips 240. For example, the first electrode pads 241 of the first semiconductor chips 240a, 240c, 240e, and 240g may be electrically connected to the first electrode fingers 216 near the first sidewall 212 of the substrate 210, and the first electrode pads 241 of the first semiconductor chips 240b, 240d, 240f, and 240h may be electrically connected to the first electrode fingers 216 near the second sidewall 214 of the substrate 210. The first semiconductor chips 240 may be understood by further referring to the description about the first semiconductor chips 140 illustrated in FIG. 1.

The supporting member 230 may support the first semiconductor chips 240. The supporting member 230 may be disposed between the substrate 210 and the first semiconductor chips 240. For example, the supporting member 230 may be interposed between the substrate 210 and the first semiconductor chip 240a, which is the lowermost semiconductor layer among the first semiconductor chips 240. The supporting member 230 may be adhered onto the substrate 210 by using an adhesion member (not shown).

The supporting member 230 may include a passive element therein, e.g., a capacitor, a resistor, and an inductor. If the supporting member 230 includes a capacitor, the supporting member 230 may be electrically connected to the second semiconductor chip 250 and function as a decoupling capacitor that reduces or minimizes signal noise. The supporting member 230 may be electrically connected to the substrate 210 through the third electrode fingers 219, and may be electrically connected to the second semiconductor chip 250 through the substrate 210. The supporting member 230 may be electrically insulated from the first semiconductor chips 240. However, the inventive concepts are not limited thereto. For example, the supporting member 230 may instead be electrically connected to the first semiconductor chips 240.

The supporting member 230 may be disposed offset inwards from at least one sidewall of the first semiconductor chip 240a. For example, the supporting member 230 may be disposed offset inwards from at least one sidewall of the first semiconductor chip 240a near the second sidewall 214. Thus, a lower surface of the first semiconductor chip 240a, for example, a portion of a non-active surface is exposed by the supporting member 230 and an offset region OA may be restricted under the exposed portion. To prevent or reduce an increase in the size of the semiconductor package 2 due to the supporting member 230, a planar size of the supporting member 230 may be smaller than a planar size of the first semiconductor chip 240a. In this regard, the term 'planar size' refers to a size of the substrate 210 when seeing above the substrate 210, for example, a size of a cross-section parallel to the substrate 210. In other embodiments of the inventive concepts, however, the planar size may instead refer to a footprint.

Other sidewalls of the supporting member 230 may be disposed either flush with corresponding sidewalls of the first semiconductor chip 240a or offset inwards. For example, an upper surface of the supporting member 230 may be entirely covered by the lower surface of the first semiconductor chip 240a. For example, the supporting member 230 may entirely overlap vertically with a portion of the first semiconductor chip 240a. When seeing above the substrate 210, the supporting member 230 is covered by the first semiconductor chip 240a and thus is not visible. Accordingly, the supporting member 230 may affect only the height of the semiconductor package 2 and may not substantially affect the planar size of the semiconductor package 2. The description about the supporting member 130 illustrated in FIG. 1 may apply as the description about the supporting member 230.

The second semiconductor chip 250 may be adhered onto the substrate 210 by using an adhesion member 252. The second semiconductor chip 250 may include an integrated circuit, e.g., a logic chip, therein. The second semiconductor chip 250 may include second electrode pads 251 electrically connected to the integrated circuit inside thereof. The second semiconductor chip 250 may have a smaller planar size than that of the first semiconductor chips 240. Accordingly, the second electrode pads 251 may be more densely arranged than the first electrode pads 241. Furthermore, the more complicated function the second semiconductor chip 250 has, the more densely the second electrode pads 251 may be arranged.

The second semiconductor chip 250 may be disposed at substantially the same level as the supporting member 230 under the first semiconductor chip 240a. For example, the second semiconductor chip 250 may be disposed adjacent to the supporting member 230 in the offset region OA under the first semiconductor chip 240a. Thus, at least a portion of the second semiconductor chip 250 may vertically overlap with a portion of the first semiconductor chip 240a. The planar size and an offset degree of the supporting member 230 may be controlled to control an overlap degree between the second semiconductor chip 250 and the first semiconductor chip 240a. This overlap arrangement may reduce or minimize an effect of a planar size of the second semiconductor chip 250 on the planar size of the semiconductor package 2. The description about the second semiconductor chip 150 illustrated in FIG. 1 may apply as the description about second semiconductor chip 250.

A molding member 270 may be formed on the substrate 210 to cover the first semiconductor chips 240 and the second semiconductor chip 250. Also, the molding member 270 may cover the supporting member 230.

Instead of the second semiconductor chip 250 illustrated in FIG. 8, the technical features of the second semiconductor chips 150a and 150b illustrated in FIG. 3 and FIG. 4 may also be applied to this embodiment. Also, instead of the substrate 210 illustrated in FIG. 8, the substrate 110c illustrated in FIG. 5 may also be applied to this embodiment.

Figure 10:
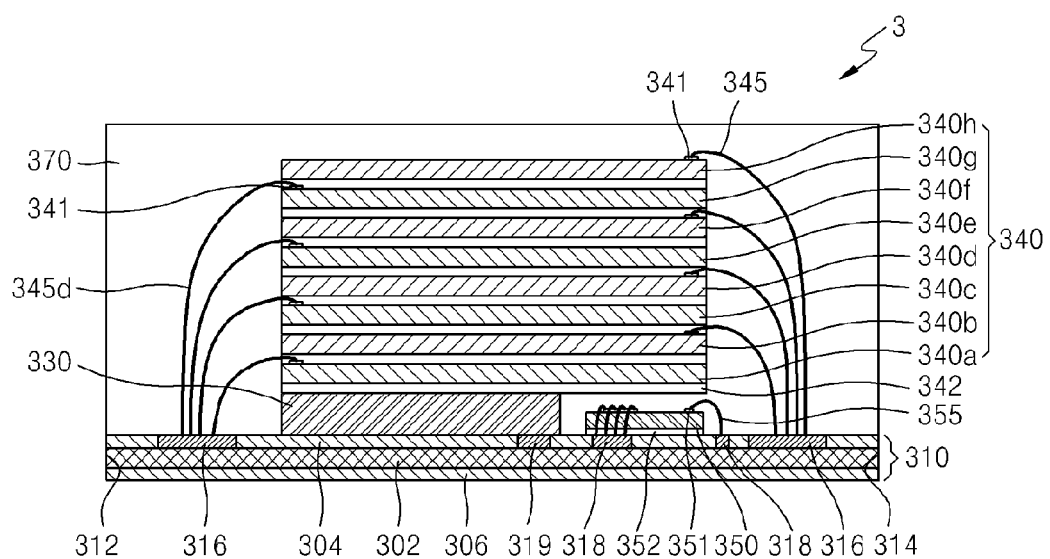
FIGS. 10 to 12 are schematic cross-sectional views of semiconductor packages according to example embodiments of the inventive concepts.
Figure 11:
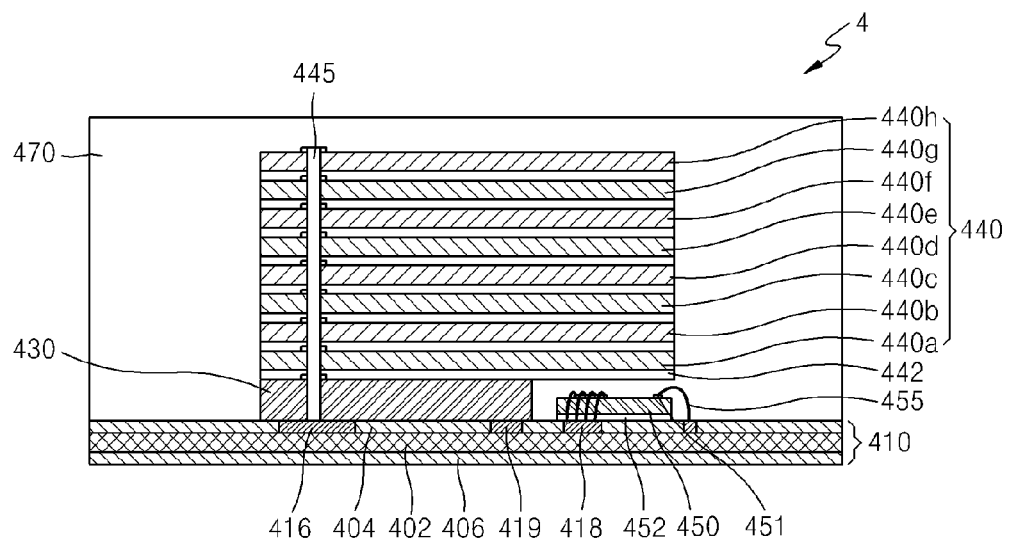
Figure 12:
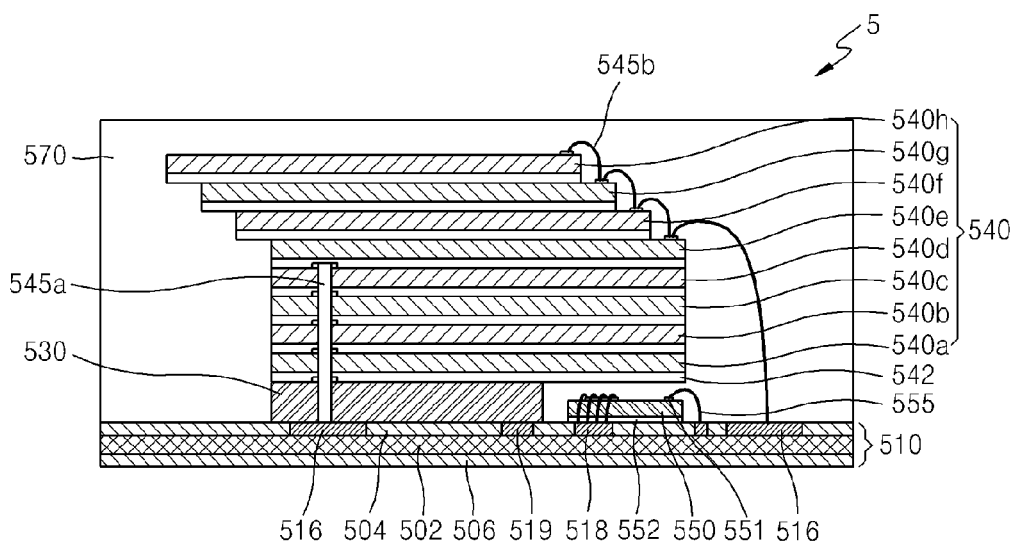

FIGS. 10 to 12 are schematic cross-sectional views of semiconductor packages 3, 4, and 5 according to other example embodiments of the inventive concepts. The semiconductor packages 3, 4, and 5 are constructed by modifying parts of the semiconductor packages 1 and 2 according to the previous example embodiments, and thus, repeated description will be omitted.

Referring to FIG. 10, the semiconductor package 3 may include first semiconductor chips 340 that are vertically aligned. For example, the first semiconductor chips 340a, 340b, 340c, 340d, 340e, 340f, 340g, and 340h may be the same kind of products and may have the same sizes, and sides thereof are vertically aligned on the same plane. For example, the first semiconductor chips 340 may be aligned with each other without offset. First connection members 345 that electrically connect the first semiconductor chips 340 to the substrate 310 may be electrically connected from electrode pads 341 to the first electrode fingers 316 of the substrate 310 through the adhesion members 342. The description about the corresponding elements illustrated in FIG. 8 may apply as the description about the supporting member 330 and the second semiconductor chip 350.

Referring to FIG. 11, the semiconductor package 4 may include first semiconductor chips 440 that are vertically aligned. For example, the first semiconductor chips 440a, 440b, 440c, 440d, 440e, 440f, 440g, and 440h may be the same kind of products and may have the same sizes, and thereof are vertically aligned on the same plane. For example, the first semiconductor chips 440 may be aligned with each other without offset. First connecting members 445 that electrically connect the first semiconductor chips 440 to the substrate 410 may each include a TSV. For example, the first connecting members 445 may be formed passing through the first semiconductor chips 440, adhesion members 442, and a supporting member 430. The first connecting members 445 may be electrically connected to the first electrode fingers 416 of the substrate 410. The description about the corresponding elements illustrated in FIG. 8 may apply as the description about the supporting member 430 and the second semiconductor chip 450.

Referring to FIG. 12, the semiconductor package 5 may have a combined structure with the technical features of the semiconductor package 1 of FIG. 1 and with the technical features of the semiconductor package 4 of FIG. 11. First semiconductor chips 540a, 540b, 540c, and 540d of first semiconductor chips 540 may be vertically aligned without offset. Also, first semiconductor chips 540e, 540f, 540g, and 540h of the first semiconductor chips 540 may be sequentially offset or may be offset in a zigzag manner. First connecting members that electrically connect the first semiconductor chips 540a, 540b, 540c, and 540d to the substrate 510 may each include a TSV. The description about the corresponding element illustrated in FIG. 11 may apply as the description about the first connecting members 545a including a TSV. Also, first connecting members 545b that electrically connect the first semiconductor chips 540e, 540f, 540g, and 540h to the substrate 510 may be bonding wires. The description about the corresponding element illustrated in FIG. 1 may apply as the description about the first connecting members 545b including bonding wires.

The semiconductor packages 3, 4, and 5 may each include, instead of the second semiconductor chips 350, 450, and 550 illustrated in FIGS. 10 to 12, the technical features of the second semiconductor chip 150a illustrated in FIG. 3 or the second semiconductor chip 150b illustrated in FIG. 4. Also, the semiconductor packages 3, 4, and 5 may include, instead of the substrates 310, 410, and 510 illustrated in FIGS. 10 to 12, the technical features of the substrate 110c illustrated in FIG. 5.

Figure 13:
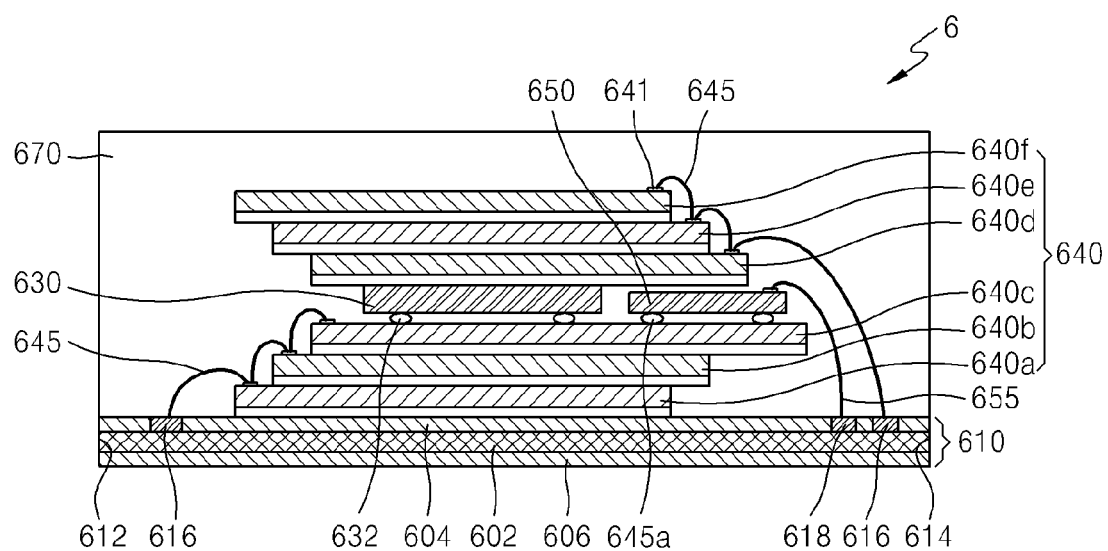
FIG. 13 is a schematic cross-sectional view of a semiconductor package according to an example embodiment of the inventive concepts.

FIG. 13 is a schematic cross-sectional view of a semiconductor package 6 according to an example embodiment of the inventive concepts. The semiconductor package 6 according to the example embodiment may be constructed by modifying parts of the semiconductor packages according to the previous example embodiments, and thus, repeated description will be omitted.

Referring to FIG. 13, the semiconductor package 6 may include a substrate 610 including a core board 602, a first resin layer 604, and a second resin layer 606. The substrate 610 may have first electrode fingers 616 and second electrode fingers 618. The substrate 610 may be understood by referring to the description about the substrate 110 illustrated in FIG. 1. Each of the first semiconductor chips 640 may be sequentially offset to expose electrode pads 641. For example, first semiconductor chips 640a, 640b, and 640c may be sequentially offset toward a second sidewall 614 of the substrate 610 and first semiconductor chips 640d, 640e, and 640f may be sequentially offset toward a first sidewall 612 of the substrate 610. The first semiconductor chips 640 may be electrically connected to the first electrode fingers 616 of the substrate 610 through first connecting members 645.

A supporting member 630 may be interposed between the first semiconductor chips 640c and 640d and may support the first semiconductor chips 640d, 640e, and 640f. A planar size of the supporting member 630 may be smaller than a planar size of the first semiconductor chip 640d. The supporting member 630 may be disposed to be covered by the first semiconductor chip 640d. The supporting member 630 may be electrically connected to the first semiconductor chip 640c through a solder ball connection member 632 and to the substrate 610 through the first connecting members 645.

A second semiconductor chip 650 may be interposed between the first semiconductor chips 640c and 640d and may be disposed at substantially the same level as the supporting member 630. The second semiconductor chip 650 may be electrically connected to the second electrode fingers 618 of the substrate 610 through second connecting members 655. Also, the second semiconductor chip 650 may be electrically connected to the first semiconductor chip 640c through a solder ball connecting member 645a and to the substrate 610 through the second connecting members 655. At least a portion of the second semiconductor chip 650 may be disposed to vertically overlap with a portion of the first semiconductor chip 640d. Furthermore, the second semiconductor chip 650 may be disposed to entirely overlap vertically with the first semiconductor chip 640c.

A molding member 670 may be formed on the substrate 610 to cover the stacked structure of the first semiconductor chips 640, the second semiconductor chip 650, and the supporting member 630.

Also, as a modified example of this embodiment, the second semiconductor chip 650 and the supporting member 630 may be disposed at substantially the same level between other layers than the first semiconductor chips 640c and 640d, for example, between the first semiconductor chips 640a and 640b.

Figure 14:
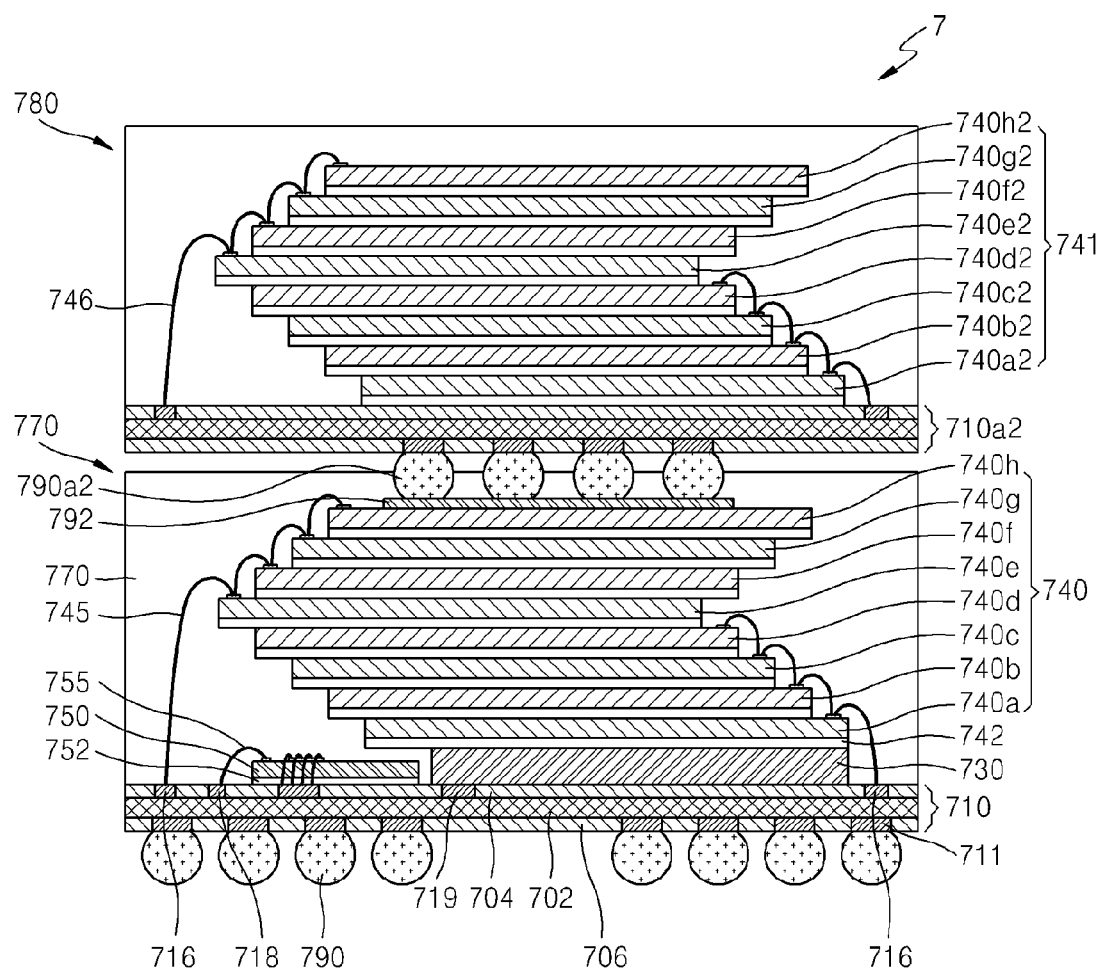
FIGS. 14 and 15 are schematic cross-sectional views of semiconductor packages according to example embodiments of the inventive concepts.
Figure 15:
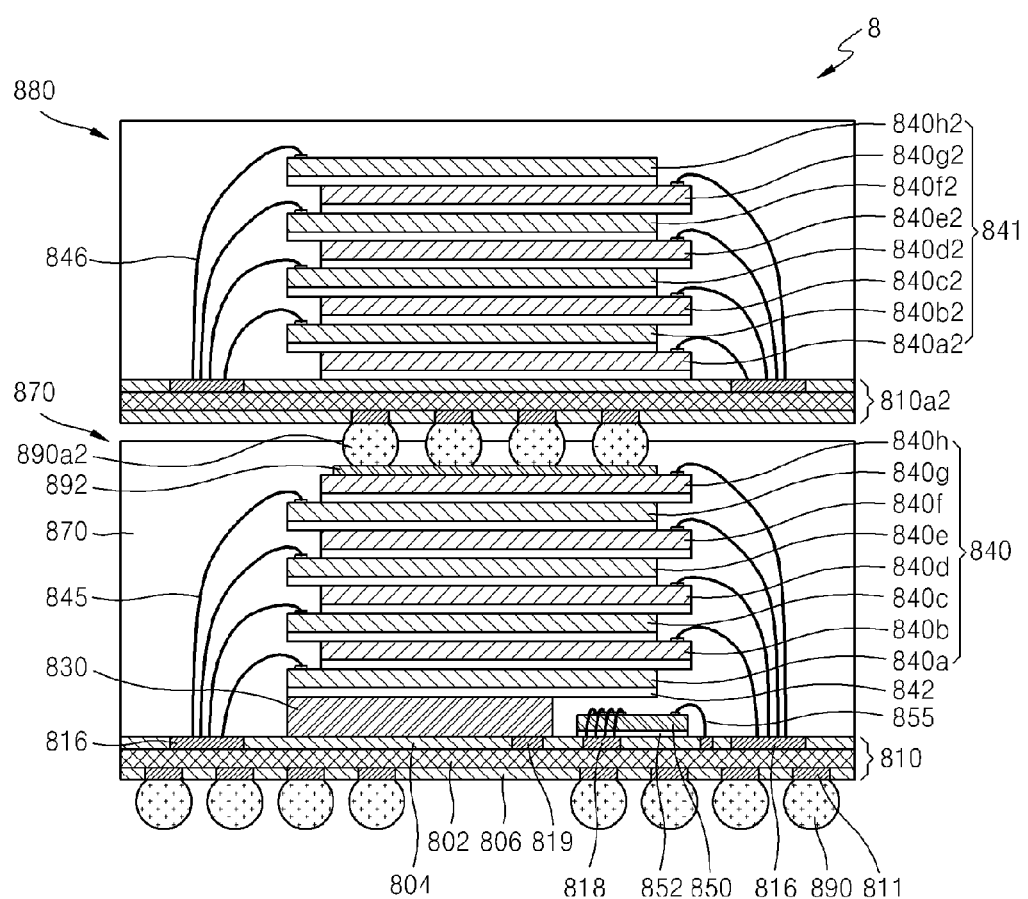

FIGS. 14 and 15 are schematic cross-sectional views of semiconductor packages 7 and 8 according to an example embodiment of the inventive concepts.

Referring to FIG. 14, the semiconductor package 7 may be understood by referring to the description about the semiconductor package 1 of FIG. 1, and thus, repeated description will be omitted.

Referring to FIG. 14, the semiconductor package 7 may have a stack module structure and may include a first semiconductor package 770 and a second semiconductor package 780 stacked on the first semiconductor package 770. The first semiconductor package 770 may have a structure that is substantially similar to that of the semiconductor package 1 of FIG. 1. The difference between the semiconductor packages 1 and 7 is that in the semiconductor package 7, bump pads 711 may be further formed in a lower surface of a first substrate 710, and first bumps 790 may be further connected onto the bump pads 711, respectively. Furthermore, a redistribution wiring line 792 electrically connected to a first semiconductor chip 740h may be further disposed on the first semiconductor chip 740h, which is the uppermost semiconductor chip among first semiconductor chips 740.

The second semiconductor package 780 may include a second substrate 710a2 and third semiconductor chips 741 stacked on the second substrate 710a2. The third semiconductor chips 741 may be electrically connected to the second substrate 710a2 through third connection lines 746. The second substrate 710a2 may be electrically connected to the redistribution wiring line 792 of the first semiconductor package 770 through second bumps 790a2. Thus, the second semiconductor package 780 may be electrically connected to the first semiconductor package 770. For example, the third semiconductor chips 741 and the first semiconductor chips 740 may be electrically connected to each other.

A supporting member 730 may support the first semiconductor chips 740. The supporting member 730 may be disposed between the substrate 710 and the first semiconductor chips 740. Also, although not illustrated, the second semiconductor package 780 may further include an additional support member (not shown) to support the third semiconductor chips 741.

Referring to FIG. 15, the semiconductor package 8 may use the semiconductor package 2 of FIG. 8, and thus, repeated description will be omitted.

Referring to FIG. 15, the semiconductor package 8 may have a stack module structure and may include a first semiconductor package 870 and a second semiconductor package 880 stacked on the first semiconductor package 870. The first semiconductor package 870 may have a structure that is substantially similar to that of the semiconductor package 2 of FIG. 8. The difference between the semiconductor packages 2 and 8 is that in the semiconductor package 8, bump pads 811 may be further formed in a lower surface of a first substrate 810, and first bumps 890 may be further connected onto the bump pads 811, respectively. Furthermore, a redistribution wiring line 892 electrically connected to the first semiconductor chip 840h may be further disposed on a first semiconductor chip 840h, which is the uppermost semiconductor chip among first semiconductor chips 840.

The second semiconductor package 880 may include a second substrate 810a2 and third semiconductor chips 841 stacked on the second substrate 810a2. The third semiconductor chips 841 may be electrically connected to the second substrate 810a2 through third connection lines 846. The second substrate 810a2 may be electrically connected to the redistribution wiring line 892 of the first semiconductor package 870 through second bumps 890a2. Thus, the second semiconductor package 880 may be electrically connected to the first semiconductor package 870. For example, the third semiconductor chips 841 and first semiconductor chips 840 may be electrically connected to each other.

A supporting member 830 may support the first semiconductor chips 840. The supporting member 830 may be disposed between the substrate 810 and the first semiconductor chips 840. Also, although not illustrated, the second semiconductor package 880 may further include an additional support member (not shown) to support the third semiconductor chips 841.

Also, the inventive concepts provide various stack module structures including the semiconductor packages described throughout the specification.

Figure 16:
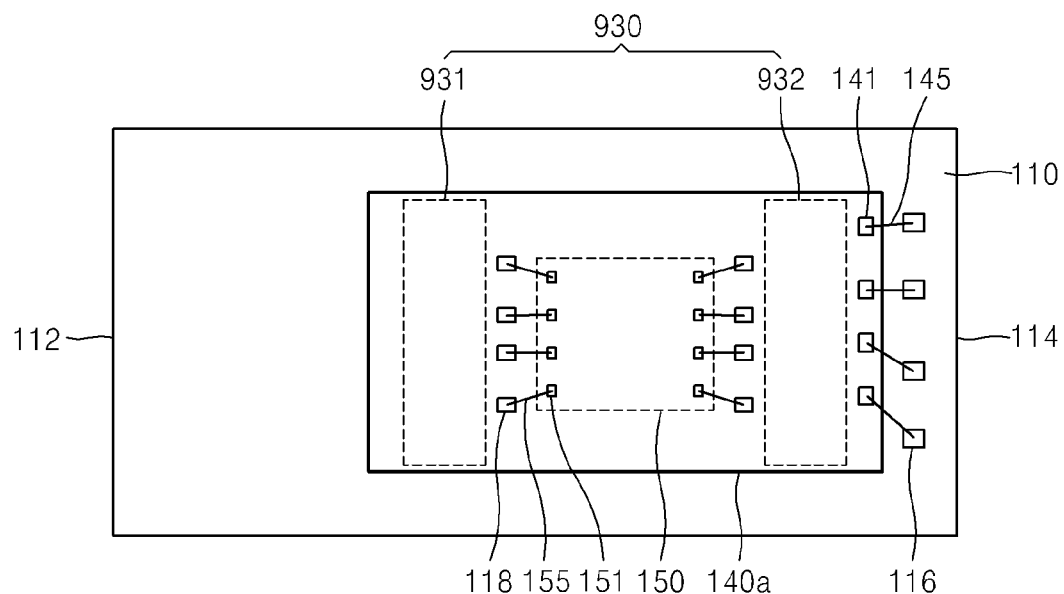
FIGS. 16 to 18 are top views of supporting members included in semiconductor packages, according to example embodiments of the inventive concepts.
Figure 17:
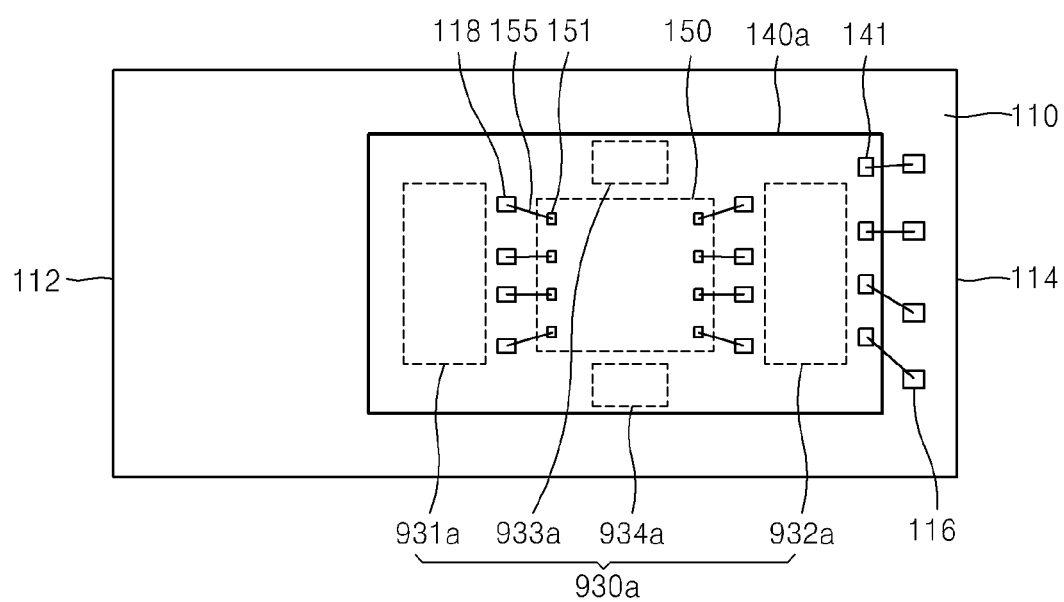
Figure 18:
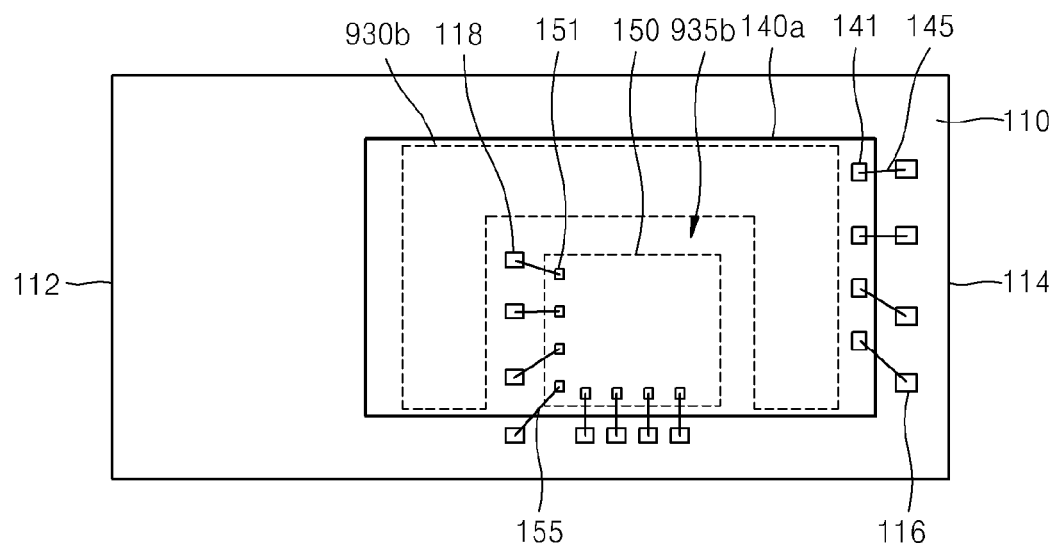

FIGS. 16 to 18 are top views of supporting members 930, 930a, and 939b included in semiconductor packages, according to example embodiments of the inventive concepts. For ease of description, a case in which other elements than the supporting member are the same as described with reference to FIGS. 1 and 2 will be exemplarily described. Accordingly, the supporting members 930, 930a, and 939b of FIGS. 16 to 18 may also be applied to the semiconductor packages according to other previous example embodiments. Also, in FIGS. 16 to 18, the elements disposed above the first semiconductor chip 140a are not illustrated.

Referring to FIG. 16, the supporting members 930 may include first and second supporting member segments 931 and 932. The first and second supporting member segments 931 and 932 may be spaced apart from each other near the second semiconductor chip 150. For example, the first and second supporting member segments 931 and 932 may be disposed on opposite sides of the second semiconductor chip 150, and also, may be disposed symmetric to each other about a center of the first semiconductor chip 140a. This symmetric structure of the supporting member 930 may stably support the first semiconductor chip 140a through equipartition of force. As described above, at least one of the first and second supporting member segments 931 and 932 may include a passive element.

Referring to FIG. 17, the supporting member 930a may include first through fourth supporting member segments 931a, 932a, 933a, and 934a. The first through fourth supporting member segments 931a, 932a, 933a, and 934a may be disposed spaced apart from each other near the second semiconductor chip 150. For example, the first through fourth supporting member segments 931a, 932a, 933a, and 934a may be disposed corresponding to four sides of the second semiconductor chip 150 and also, may be disposed symmetric to each other about a center of the first semiconductor chip 140a. This symmetric structure of the supporting member 930a may stably support the first semiconductor chip 140a through equipartition of force. As described above, at least one of the first through fourth supporting member segments 931a, 932a, 933a, and 934a may include a passive element.

Referring to FIG. 18, the supporting member 930b may surround the second semiconductor chip 150 on at least three sides thereof. Thus, the supporting member 930b has a space 935b and the second semiconductor chip 150 may be disposed in the space 935b. For example, the supporting member 930b may surround three sides of the second semiconductor chip 150 and may not surround the other side thereof. The first semiconductor chip 140a may cover the supporting member 930b and may also entirely or partially cover the second semiconductor chip 150. The molding member (see 170 of FIG. 1) may fill the space 935b defined by the supporting member 930b. Because the supporting member 930b is located adjacent to at least three sides of the second semiconductor chip 150 to support the first semiconductor chip 140a, the first semiconductor chip 140a may be more stably supported by the supporting member 930b. As described above, the supporting member 930b may include a passive element.

FIGS. 19 to 24 are a schematic view for explaining an electrical connection relationship of supporting members 130 according to example embodiments of the inventive concepts. For ease of description, an electrical connection relationship among the supporting member 130, the second semiconductor chip 150, and the substrate 110 illustrated in FIGS. 1 and 2 is exemplarily described. Accordingly, the electrical connection relationship of the supporting member 130 described with reference to FIGS. 19 to 24 may also be applied to semiconductor packages according to other example embodiments.

Figure 19:
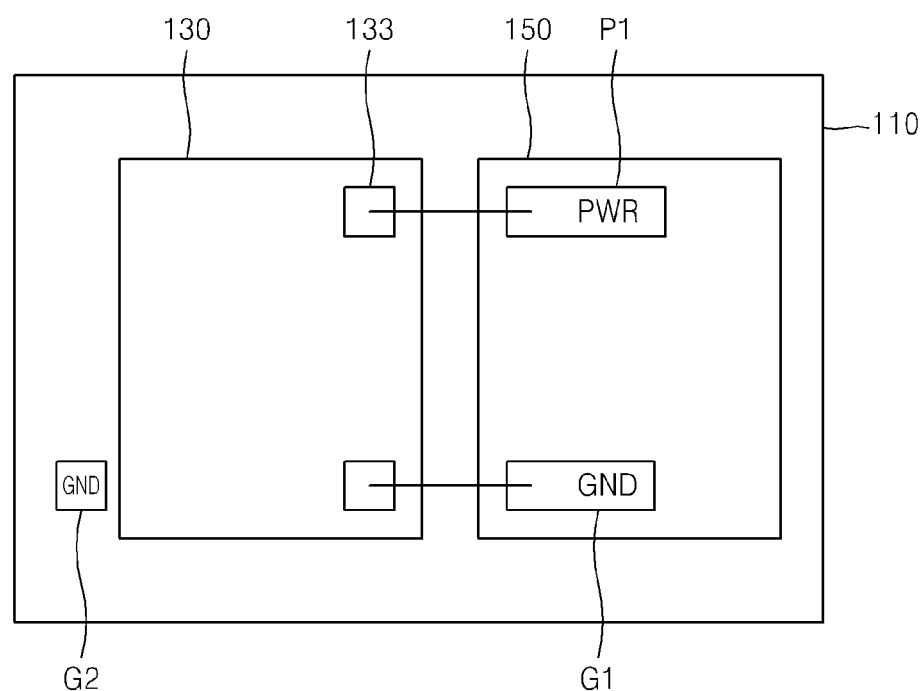
FIGS. 19 to 24 are a schematic view for explaining an electrical connection relationship of a supporting member.

Referring to FIG. 19, some of the terminals 133 included in the supporting member 130 may be electrically connected to a power terminal P1 of the second semiconductor chip 150. Also, some of the terminals 133 of the supporting member 130 may be electrically connected to a ground terminal G1 of the second semiconductor chip 150. The supporting member 130 may not be electrically connected to a ground terminal G2 of the substrate 110. Thus, the supporting member 130 may be supplied with power by the second semiconductor chip 150 and may be grounded through the second semiconductor chip 150.

Figure 20:
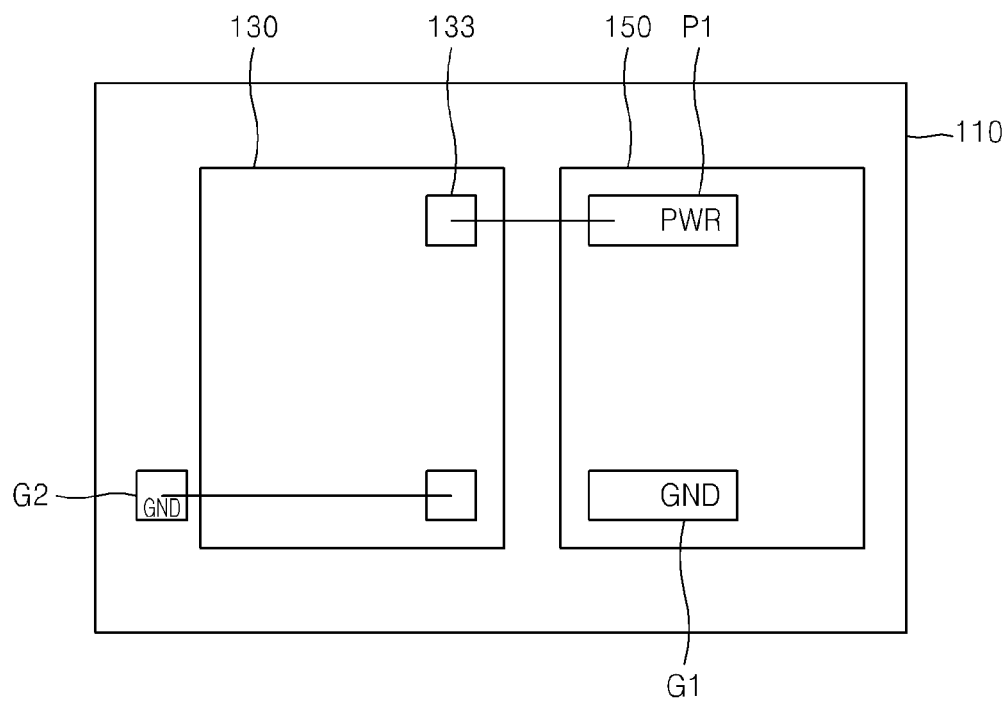

Referring to FIG. 20, some of the terminals 133 of the supporting member 130 may be electrically connected to the power terminal P1 of the second semiconductor chip 150. Also, some of the terminals 133 of the supporting member 130 may be electrically connected to the ground terminal G2 of the substrate 110. The supporting member 130 may not be electrically connected to the ground terminal G1 of the second semiconductor chip 150. Thus, the supporting member 130 may be supplied with power by the second semiconductor chip 150 and may be grounded through the substrate 110.

Figure 21:
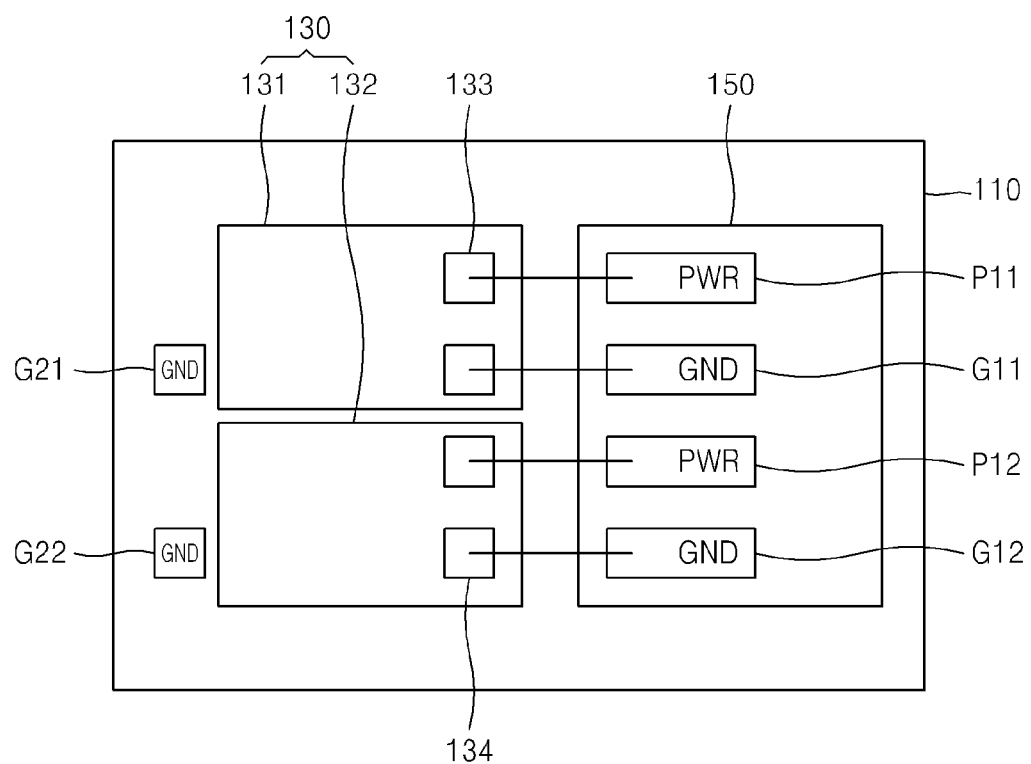

Referring to FIG. 21, the supporting member 130 may include a first supporting member 131 and a second supporting member 132. Some of the terminals 133 of the first supporting member 131 may be electrically connected to a power terminal P11 of the second semiconductor chip 150. Also, some of the terminals 133 of the first supporting member 131 may be electrically connected to a ground terminal G11 of the second semiconductor chip 150. Some of the terminals 134 of the second supporting member 132 may be electrically connected to a power terminal P12 of the second semiconductor chip 150. Also, some of the terminals 134 of the second supporting member 132 may be electrically connected to a ground terminal G12 of the second semiconductor chip 150. The first supporting member 131 and the second supporting member 132 may not be electrically connected to ground terminals G21 and G22 of the substrate 110.

Figure 22:
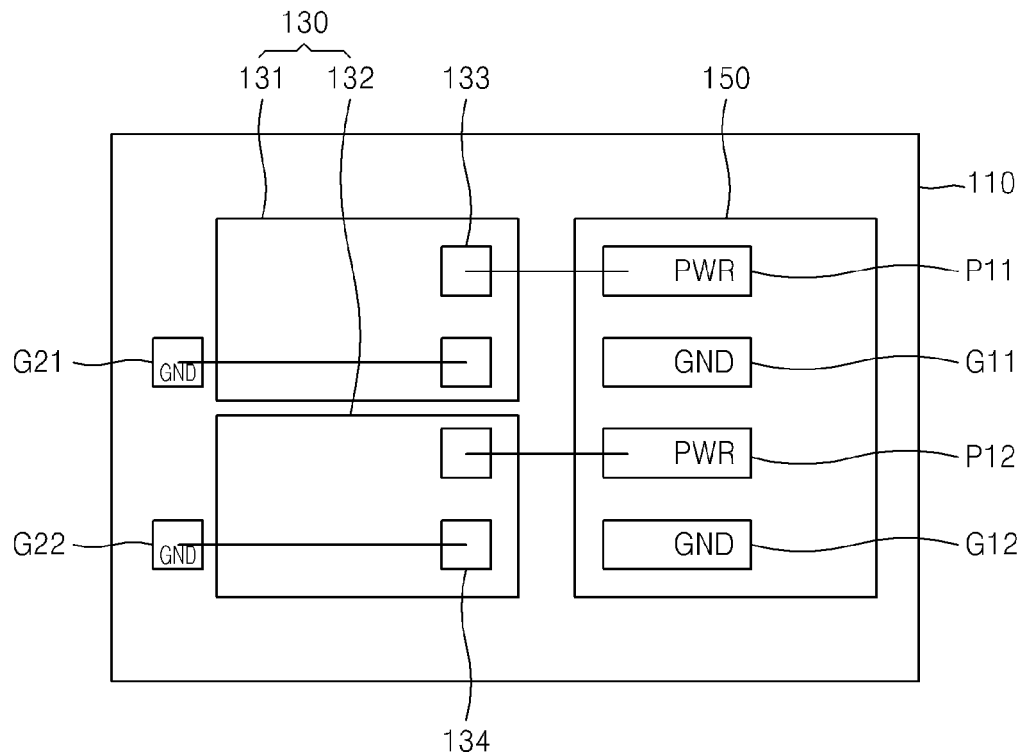

Referring to FIG. 22, the supporting member 130 may include the first supporting member 131 and the second supporting member 132. Some of the terminals 133 of the first supporting member 131 may be electrically connected to the power terminal P11 of the second semiconductor chip 150. Also, some of the terminals 133 of the first supporting member 131 may be electrically connected to the ground terminal G21 of the substrate 110. Some of the terminals 134 of the second supporting member 132 may be electrically connected to the power terminal P12 of the second semiconductor chip 150. Also, some of the terminals 134 of the second supporting member 132 may be electrically connected to the ground terminal G22 of the substrate 110. The first supporting member 131 and the second supporting member 132 may not be electrically connected to the ground terminals G11 and G12 of the substrate 110.

Figure 23:
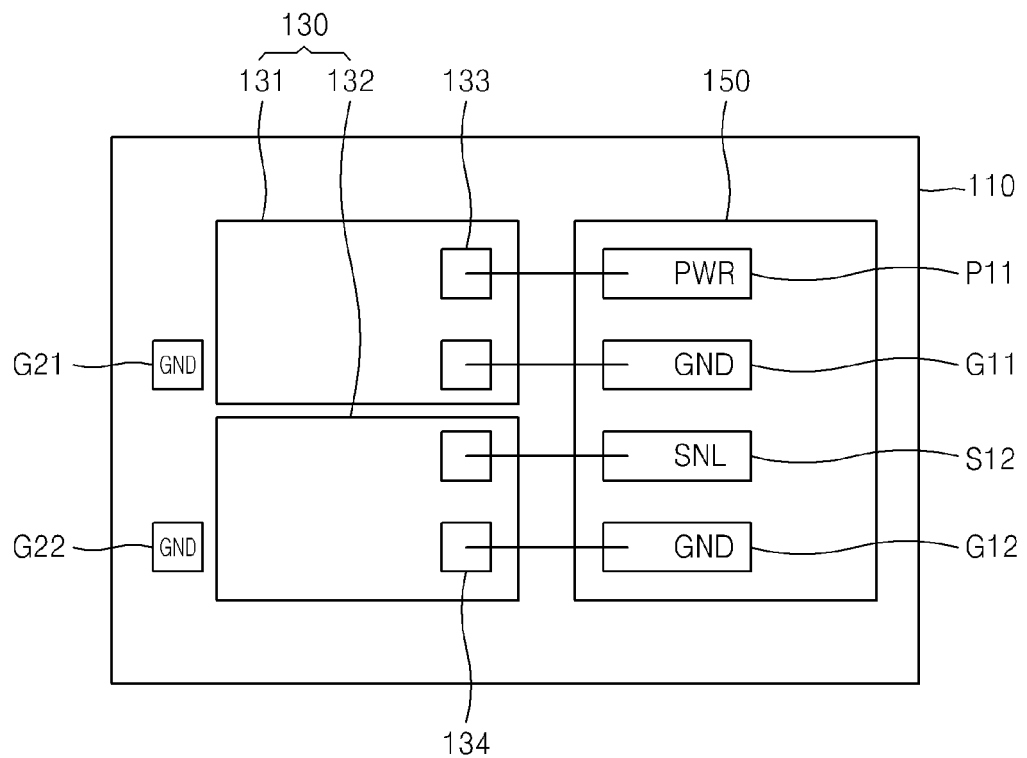

Referring to FIG. 23, the supporting member 130 may include the first supporting member 131 and the second supporting member 132. Some of the terminals 133 of the first supporting member 131 may be electrically connected to the power terminal P11 of the second semiconductor chip 150. Also, some of the terminals 133 of the first supporting member 131 may be electrically connected to the ground terminal G11 of the second semiconductor chip 150. Some of the terminals 134 of the second supporting member 132 may be electrically connected to a signal terminal S12 of the second semiconductor chip 150. Also, some of the terminals 134 of the second supporting member 132 may be electrically connected to the ground terminal G12 of the second semiconductor chip 150. The first supporting member 131 and the second supporting member 132 may not be electrically connected to the ground terminals G21 and G22 of the substrate 110.

Figure 24:
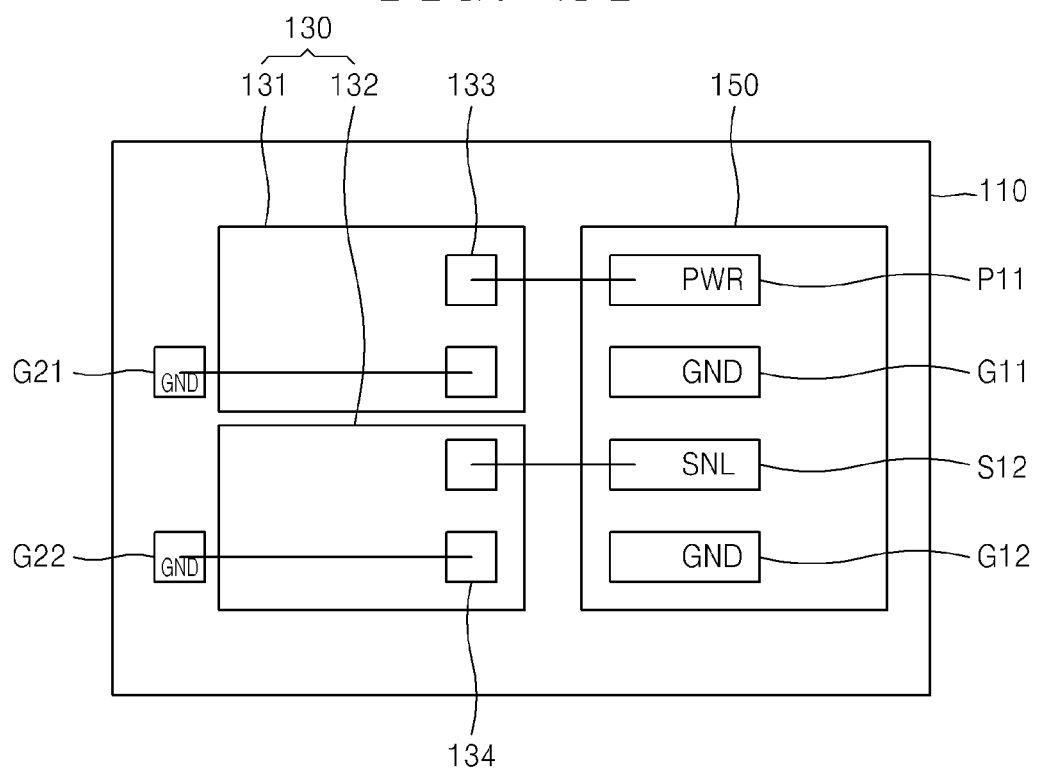

Referring to FIG. 24, the supporting member 130 may include the first supporting member 131 and the second supporting member 132. Some of the terminals 133 of the first supporting member 131 may be electrically connected to the power terminal P11 of the second semiconductor chip 150. Also, some of the terminals 133 of the first supporting member 131 may be electrically connected to the ground terminal G21 of the substrate 110. Some of the terminals 134 of the second supporting member 132 may be electrically connected to the signal terminal S12 of the second semiconductor chip 150. Also, some of the terminals 134 of the second supporting member 132 may be electrically connected to the ground terminal G22 of the substrate 110, the first supporting member 131 and the second supporting member 132 may not be electrically connected to the ground terminals G11 and G12 of the substrate 110.

FIGS. 25 to 33 are views of various supporting members 1300 to 1307 and 1309 according to example embodiments of the inventive concepts. The supporting members 1300 to 1307 and 1309 described with reference to FIGS. 25 to 33 may be applicable to all of the above example embodiments. The supporting member 1300 to 1307 of FIGS. 25 to 32 will be exemplarily described in detail, considering that the supporting members 1300 to 1307 are capacitors. The supporting member 1309 of FIG. 33 will be exemplarily described in detail, considering that the supporting member 1309 is a combined structure including a capacitor, an inductor, and a resistor. However, the inventive concepts are not limited thereto.

Figure 25:
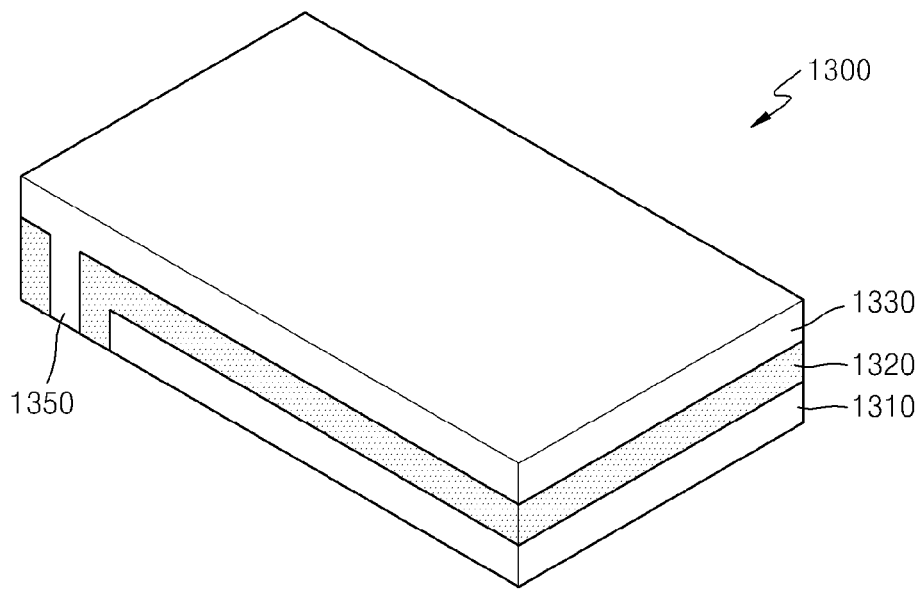
FIGS. 25 to 33 are views of various supporting members according to example embodiments of the inventive concepts.

Referring to FIG. 25, the supporting member 1300 may have a planar capacitor structure that includes a first electrode 1310, a dielectric layer 1320, and a second electrode 1330 which are vertically stacked. Also, the dielectric layer 1320 may be interposed between the first electrode 1310 and the second electrode 1330 to electrically insulate the first electrode 1310 from the second electrode 1330. The first electrode 1310 and the second electrode 1330 may include a conductive material, for example, metal, e.g., copper or aluminum. The dielectric layer 1320 may include an insulating material, for example, a high-k material. The first electrode 1310 may be disposed contacting the substrate 110 (see FIG. 1) and may be electrically connected to the third electrode fingers 119 (see FIG. 1). The second electrode 1330 may be electrically connected to the third electrode fingers 119 (see of FIG. 1) of the substrate 110 (see FIG. 1) through a plug 1350. This capacitor may effectively cope with power noise. For example, the supporting member 1300 may compensate limited capacitance of a semiconductor package, may disperse power noise, and compensate signals.

Figure 26:
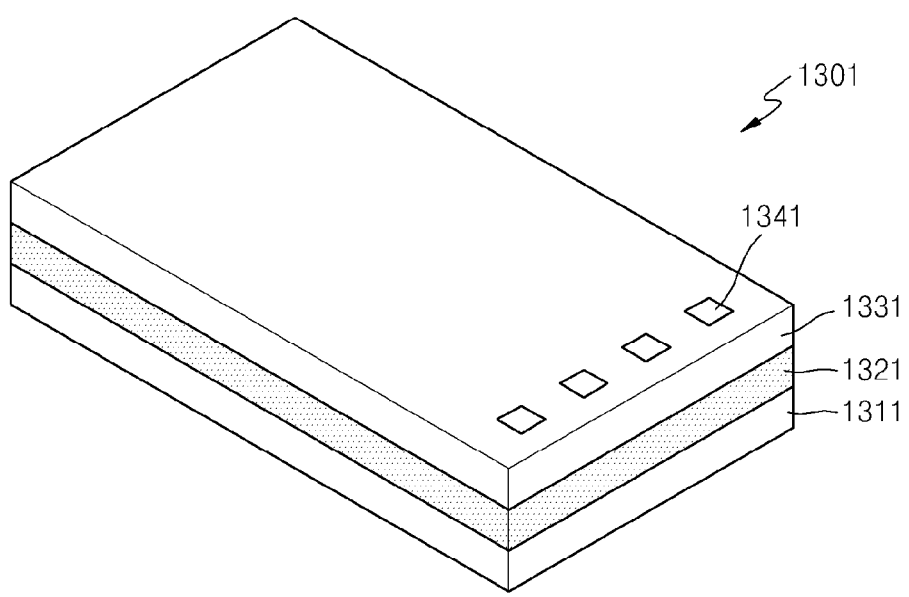

Referring to FIG. 26, the supporting member 1301 may have a capacitor structure that includes a first electrode 1311, a dielectric layer 1321, and a second electrode 1331 which are vertically stacked. Also, the dielectric layer 1321 may be interposed between the first electrode 1311 and the second electrode 1331 to electrically insulate the first electrode 1311 from the second electrode 1331. The first electrode 1311 may be disposed contacting the substrate 110 (see FIG. 1) and may be electrically connected to the third electrode fingers 119 (see FIG. 1). The second electrode 1331 may be electrically connected to the fourth electrode fingers 119*d* (see FIG. 6) of the substrate 110 (see FIG. 6) through a pad 1341 and the supporting member connection member 145*d* (see FIG. 6).

Figure 27:
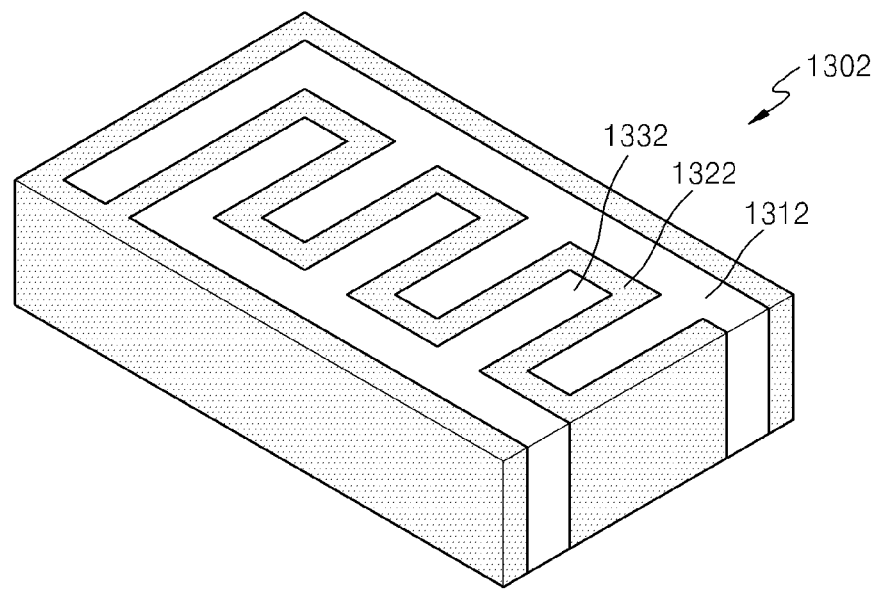

Referring to FIG. 27, the supporting member 1302 may have a finger-shape capacitor structure that includes a first electrode 1312, a dielectric layer 1322, and a second electrode 1332 which are laterally aligned. Also, the dielectric layer 1322 may be interposed between the first electrode 1312 and the second electrode 1332 to electrically insulate the first electrode 1312 from the second electrode 1332. The first electrode 1312 and the second electrode 1332 may each have a finger shape, and thus, may have wide surface areas. The first electrode 1312 and the second electrode 1332 may be disposed so that each of the first electrode 1312 and the second electrode 1332 contacts the substrate 110 (see FIG. 1) and may each be electrically connected to the third electrode fingers 119 (see FIG. 1). Each of the first electrode 1312 and the second electrode 1332 may have a finger shape extending parallel to the substrate 110 (see FIG. 1).

Figure 28:
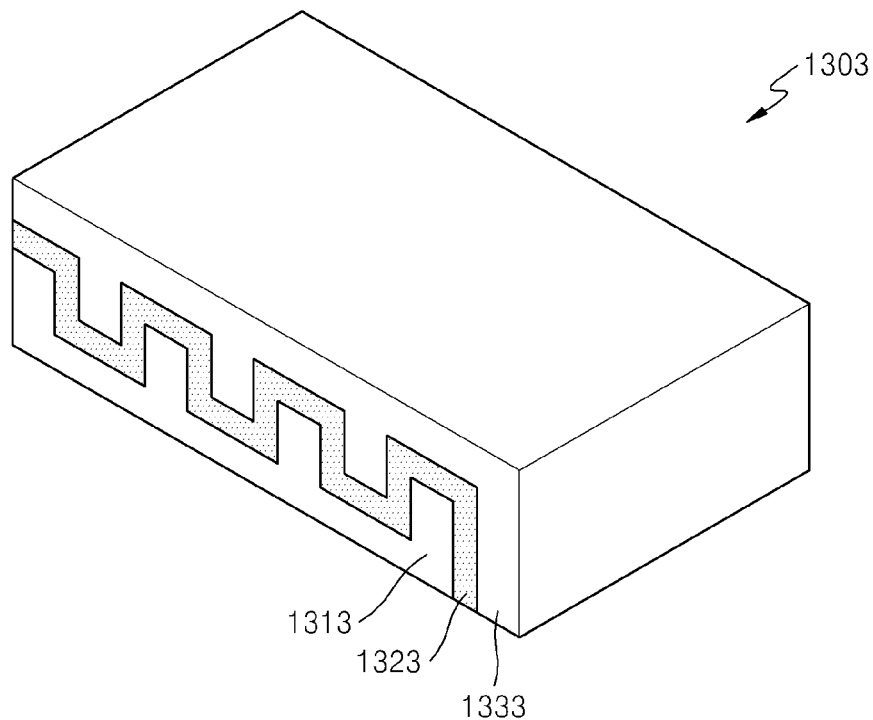

Referring to FIG. 28, the supporting member 1303 may have a finger-shape capacitor structure that includes a first electrode 1313, a dielectric layer 1323, and a second electrode 1333 which are vertically stacked. Also, the dielectric layer 1323 may be interposed between the first electrode 1313 and the second electrode 1333 to electrically insulate the first electrode 1313 from the second electrode 1332. The first electrode 1313 and the second electrode 1333 may each have a finger shape, and thus, may have wide surface areas. The first electrode 1313 and the second electrode 1333 may be disposed so that each of the first electrode 1313 and the second electrode 1333 contacts the substrate 110 (see FIG. 1) and may each be electrically connected to the third electrode fingers 119 (see FIG. 1). Each of the first electrode 1313 and the second electrode 1333 may have a finger shape extending perpendicular to the substrate 110 (see FIG. 1).

Figure 29:
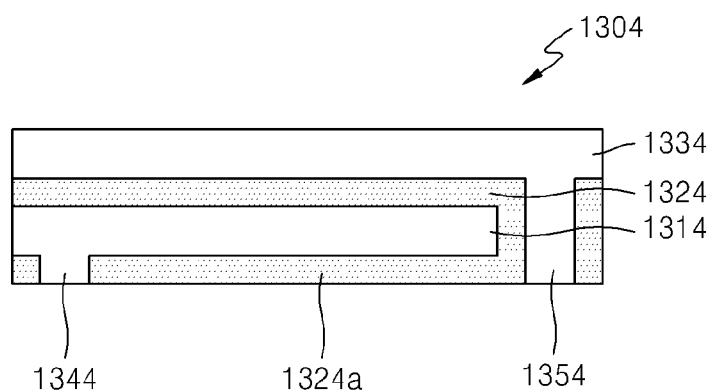

Referring to FIG. 29, the supporting member 1304 may have a capacitor structure that includes a first electrode 1314, a dielectric layer 1324, and a second electrode 1334 which are vertically stacked. Also, the dielectric layer 1324 may be interposed between the first electrode 1314 and the second electrode 1334 to electrically insulate the first electrode 1314 from the second electrode 1334. The dielectric layer 1324 may have a dielectric layer extension portion 1324*a* extending below the first electrode 1314. The first electrode 1314 may be electrically connected to the third electrode fingers 119 (see FIG. 1) of the substrate 110 (see FIG. 1) through a first plug 1344. The second electrode 1334 may be electrically connected to the third electrode fingers 119 (see FIG. 1) of the substrate 110 (see FIG. 1) through a second plug 1354.

Figure 30:
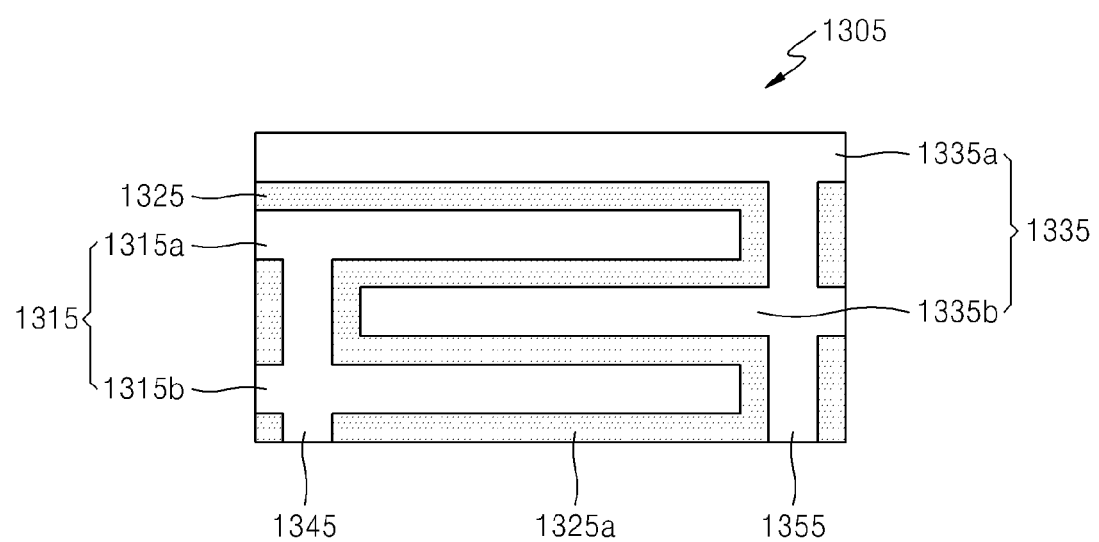

Referring to FIG. 30, the supporting member 1305 may have a capacitor structure that includes a first electrode 1315, a dielectric layer 1325, and a second electrode 1335 which are vertically stacked. The first electrode 1315 and the second electrode 1335 may each have a finger shape. The first electrode 1315 may include a plurality of layers 1315*a* and 1315*b* connected to each other and the second electrode 1335 may include a plurality of layers 1335*a* and 1335*b*. The dielectric layer 1325 may be interposed between the first electrode 1315 and the second electrode 1335 to electrically insulate the first electrode 1315 from the second electrode 1335. The dielectric layer 1325 may have a dielectric layer extension portion 1325*a* extending below the first electrode 1315. The first electrode 1315 may be electrically connected to the third electrode fingers 119 (see FIG. 1) of the substrate 110 (see FIG. 1) through a first plug 1345. The second electrode 1335 may be electrically connected to the third electrode fingers 119 (see FIG. 1) of the substrate 110 (see FIG. 1) through a second plug 1355.

Figure 31:
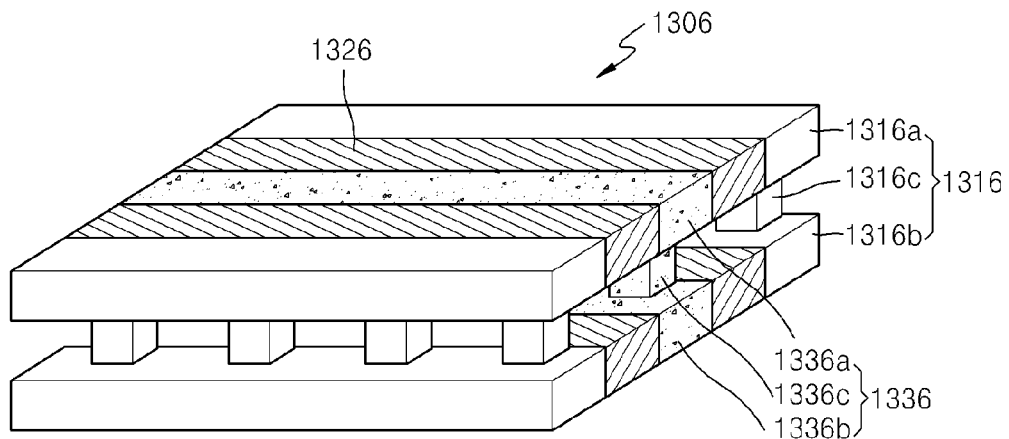

Referring to FIG. 31, the supporting member 1306 may have a capacitor structure that includes a first electrode 1316, a dielectric layer 1326, and a second electrode 1336. The first electrode 1316 and the second electrode 1336 may each extend in a first direction. Also, the first electrode 1316 and the second electrode 1336 may be alternately aligned. The first electrode 1316 may include a first extension portion 1316*a*, a second extension portion 1316*b*, and a first connection portion 1316*c* that connects the first extension portion 1316*a* to the second extension portion 1316*b*. Also, the second electrode 1336 may include a third extension portion 1336*a*, a fourth extension portion 1336*b*, and a second connection portion 1336*c* that connects the third extension portion 1336*a* to the fourth extension portion 1336*b*. The dielectric layer 1326 is interposed between the first electrode 1316 and the second electrode 1336 to electrically insulate the first electrode 1316 from the second electrode 1336.

Figure 32:
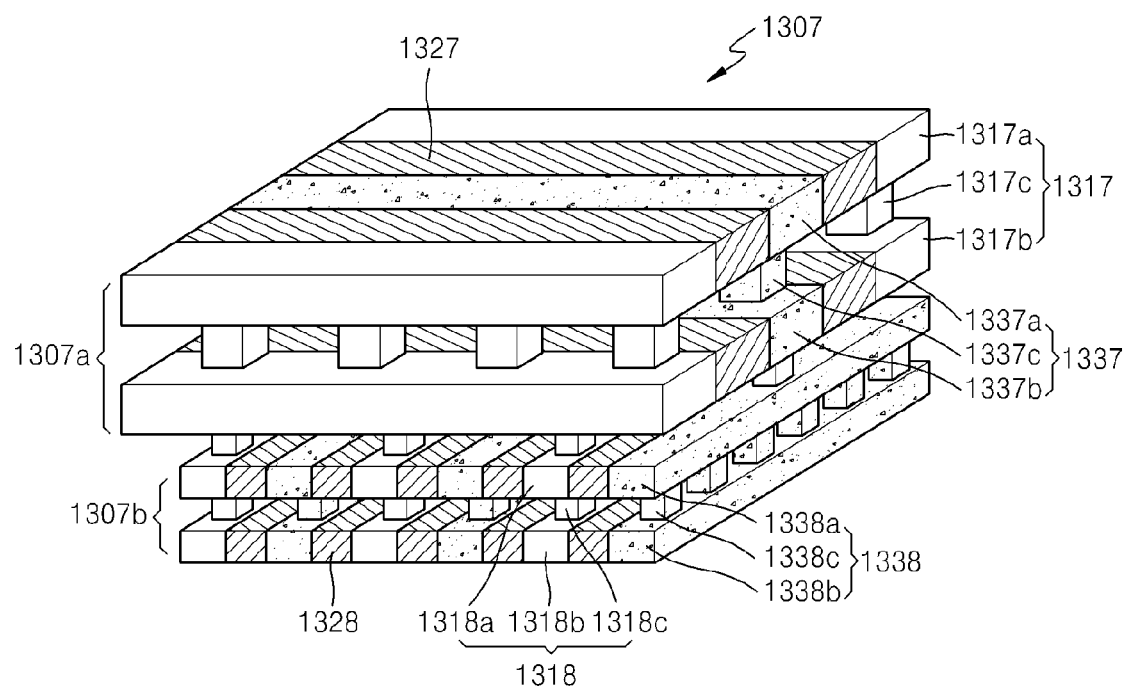

Referring to FIG. 32, the supporting member 1307 may have a capacitor structure that includes a plurality of the supporting members 1306 of FIG. 31 that are stacked in alternate directions. The supporting member 1307 may include an upper portion 1307*a* and a lower portion 1307*b*.

The upper portion 1307*a* may include a first electrode 1317, a second electrode 1337, and a first dielectric layer 1327 interposed between the first electrode 1317 and the second electrode 1337. The first electrode 1317 may include a first extension portion 1317*a*, a second extension portion 1317*b*, and a first connection portion 1317*c* that connects the first extension portion 1317*a* to the second extension portion 1317*b*. Also, the second electrode 1337 may include a third extension portion 1337*a*, a fourth extension portion 1337*b*, and a second connection portion 1337*c* that connects the third extension portion 1337*a* to the fourth extension portion 1337*b*.

The lower portion 1307*b* may include a third electrode 1318, a fourth electrode 1338, and a second dielectric layer 1328 interposed between the third electrode 1318 and the fourth electrode 1338. The third electrode 1318 may include a fifth extension portion 1318*a*, a sixth extension portion 1318*b*, and a third connection portion 1318*c* that connects the fifth extension portion 1318*a* to the sixth extension portion 1318*b*. Also, the fourth electrode 1338 may include a seventh extension portion 1338*a*, an eighth extension portion 1338*b*, and a fourth connection portion 1338*c* that connects the seventh extension portion 1338*a* to the eighth extension portion 1338*b*.

The first electrode 1317 and the second electrode 1337 may each extend in a first direction. The third electrode 1318 and the fourth electrode 1338 may each extend in a second direction that is different from the first direction. The first electrode 1317 and the third electrode 1318 may be electrically insulated from each other. The second electrode 1337 and the fourth electrode 1338 may be electrically insulated from each other.

Figure 33:
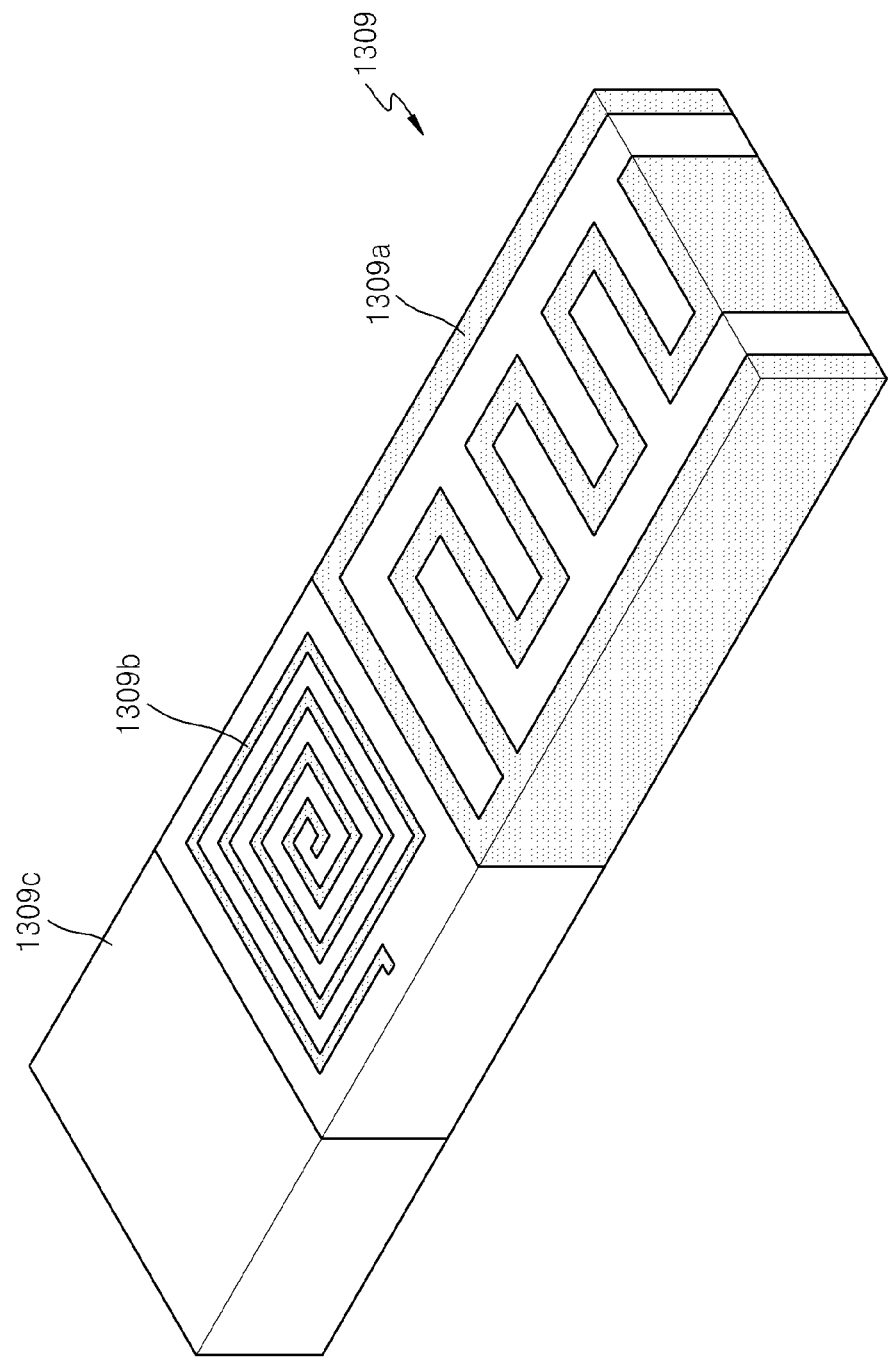

Referring to FIG. 33, the supporting member 1309 may include at least one of a capacitor 1309*a*, an inductor 1309*b*, and a resistor 1309*c*. The capacitor 1309*a* may have at least one structure of the above example embodiments. The inductor 1309*b* may have the illustrated coil shape, but the shape of the inductor 1309*b* is not limited thereto. The resistor 1309*c* may include a resistor, for example, polysilicon. The capacitor 1309*a*, the inductor 1309*b*, and the resistor 1309*c* may be connected in series or parallel.

Figure 34:
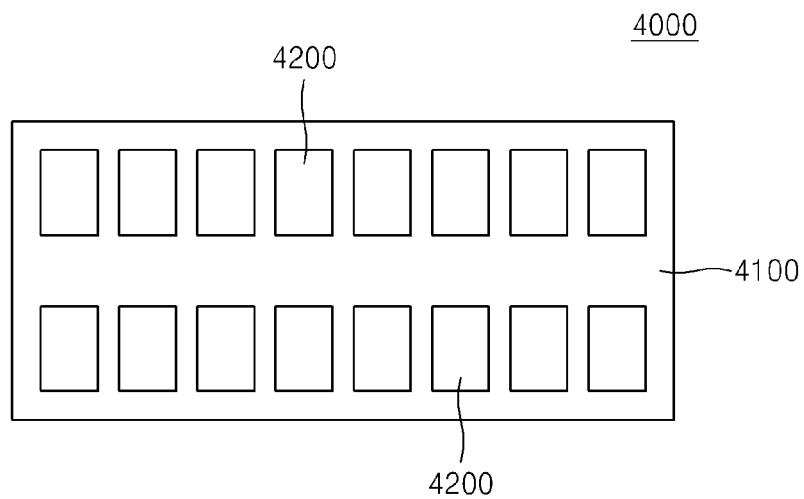
FIG. 34 is a schematic plan view of a memory module including semiconductor packages according to example embodiments of the inventive concepts.

FIG. 34 is a schematic plan view of a memory module 4000 including semiconductor packages according to example embodiments of the inventive concepts.

Referring to FIG. 34, the memory module 4000 may include a printed circuit board substrate 4100 and a plurality of semiconductor packages 4200. The semiconductor packages 4200 may include the semiconductor packages according to example embodiments of the inventive concepts. The memory module 4000 may be either a single in-lined memory module (SIMM) including the semiconductor packages 4200 mounted on only one surface of the printed circuit board substrate 4100 or a dual in-lined memory module (DIMM) including the semiconductor packages 4200 mounted on opposite surfaces of the printed circuit board substrate 4100. Also, the memory module 4000 according to example embodiments of the inventive concepts may be a fully buffered DIMM (FBDIMM) including an advanced memory buffer (AMB) that provides external signals to each of the semiconductor package 4200.

Figure 35:
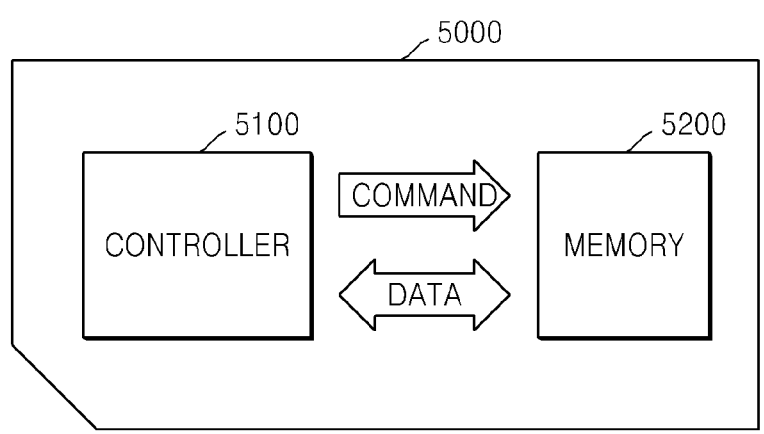
FIG. 35 is a schematic view of a card according to an example embodiment of the inventive concepts.

FIG. 35 is a schematic view of a card 5000 according to an example embodiment of the inventive concepts.

Referring to FIG. 35, a controller 5100 and a memory 5200 may be disposed in such a way that the controller 5100 and the memory 5200 exchange electrical signals. For example, if the controller 5100 provides a command, the memory 5200 may transmit data. The memory 5200 may include the semiconductor packages according to example embodiments of the inventive concepts. Semiconductor packages according to example embodiments of the inventive concepts may be aligned in an architecture memory array (not shown) corresponding to a corresponding logic gate. A memory array aligned in a plurality of rows and columns may constitute one or more memory array banks (not shown). The memory 5200 may include a memory array (not shown) or a memory array bank (not shown). Also, the card 5000 may further include a conventional row decoder (not shown), a conventional column decoder (not shown), conventional I/O buffers (not shown), and/or conventional control registers (not shown) to drive the memory array bank (not shown). The card 5000 may be applicable to various kinds of cards, for example, a memory device, e.g., a memory stick card, a smart media (SM) card, a secure digital (SD) card, a mini secure digital (SD) card, or a multimedia card (MMC).

Figure 36:
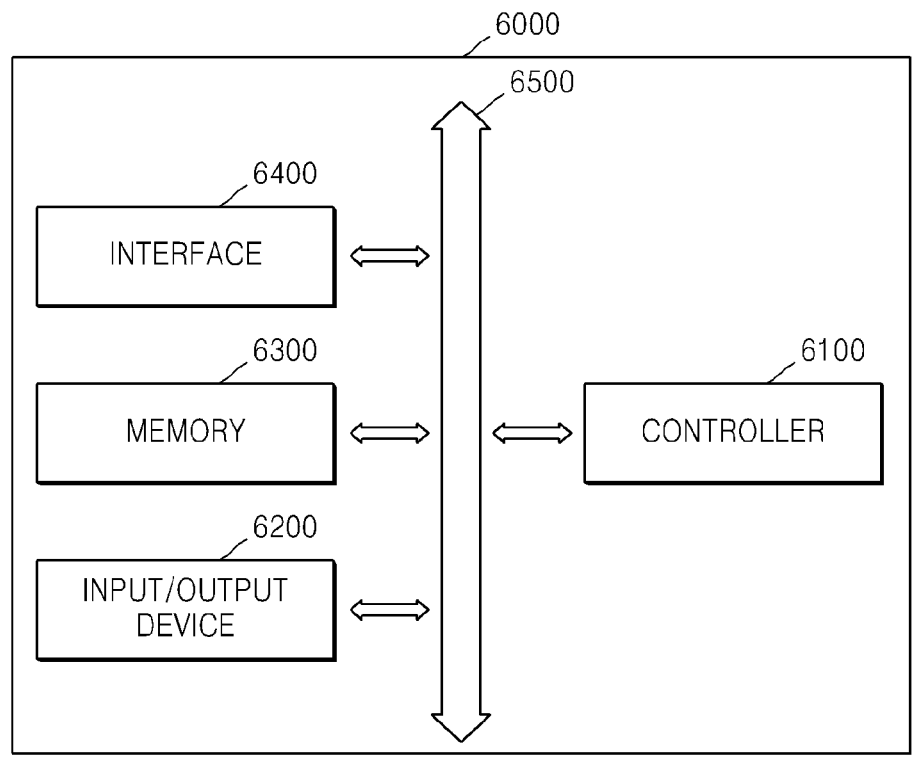
FIG. 36 is a schematic view of a system according to an example embodiment of the inventive concepts.

FIG. 36 is a schematic view of a system 6000 according to an example embodiment of the inventive concepts.

Referring to FIG. 36, the system 6000 may include a controller 6100, an input/output device 6200, a memory 6300, and an interface 6400. The system 6000 may be a mobile system or a system that transmits or receives information. The mobile system may be a personal digital application (PDA), a portable computer, a web tablet, a wireless phone, a mobile phone, a digital music player, or a memory card. The controller 6100 may perform a program and control the system 6000. The controller 6100 may be, for example, a microprocessor, a digital signal processor, a microcontroller, or the like. The input/output device 6200 may input data to or output data from the system 6000. The system 6000 may be connected to an external device, e.g., a personal computer or a network, by using the input/output device 6200 to exchange data with the external device. The input/output device 6200 may be, for example, a keypad, a keyboard, or a display device. The memory 6300 may store a code and/or data for driving the controller 6100, and/or may store data that has been processed by the controller 6100. The memory 6300 may include the semiconductor packages described above according to example embodiments of the inventive concepts. The interface 6400 may be a data transmission pathway between the system 6000 and a different external device. The controller 6100, the input/output device 6200, the memory 6300, and the interface 6400 may communicate with each other via a bus 6500. For example, the system 6000 may be used in a mobile phone, an MP3 player, a navigation device, a portable multimedia player (PMP), a solid state disk (SSD), or household appliances.

Figure 37:
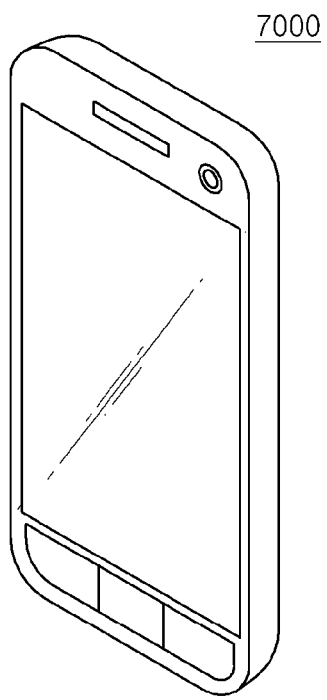
FIG. 37 is a perspective view of an electronic device to which a semiconductor device according to an example embodiment of the inventive concepts is applicable.

FIG. 37 is a perspective view of an electronic device 7000 to which a semiconductor device according to example embodiments of the inventive concepts is applicable.

Referring to FIG. 37, the electronic system 7000 may be a case in which the electronic system 6000 (see FIG. 35) is applied to a mobile phone. Besides the mobile phone, the electronic system 6000 (see FIG. 35) may also be applicable to an MP3 player, a navigation device, a portable multimedia player (PMP), a solid state disk (SSD), a vehicle, or household appliances.

The foregoing is illustrative of exemplary embodiments and is not to be construed as limiting thereof. Although exemplary embodiments have been described, those of ordinary skill in the art will readily appreciate that many modifications are possible in the exemplary embodiments without materially departing from the novel teachings of the example embodiments. Accordingly, all such modifications are intended to be included within the scope of the claims. Exemplary embodiments are defined by the following claims, with equivalents of the claims to be included therein.

What is claimed is:
1. A semiconductor package comprising
a package substrate;
a plurality of first semiconductor chips stacked on the package substrate, the first semiconductor chips stacked on each other;
a second semiconductor chip between the package substrate and a lowermost semiconductor chip among the first semiconductor chips; and
a supporting member between the package substrate and the lowermost semiconductor chip among the first semiconductor chips, the supporting member configured to support the first semiconductor chips and including a passive element.

2. The semiconductor package of claim 1, wherein a planar size of the supporting member is smaller than planar sizes of the first semiconductor chips.

3. The semiconductor package of claim 1, wherein the supporting member is entirely covered by a lower surface of the lowermost semiconductor chip.

4. The semiconductor package of claim 1, wherein a sidewall of the supporting member is disposed offset inwards with respect to a sidewall of the lowermost semiconductor chip.

5. The semiconductor package of claim 1, wherein a sidewall of the supporting member protrudes from a sidewall of the lowermost semiconductor chip.

6. The semiconductor package of claim 1, wherein the supporting member is electrically connected to the package substrate.

7. The semiconductor package of claim 1, wherein the supporting member includes a plurality of supporting member segments spaced apart from each other and surrounding the second semiconductor chip.

8. The semiconductor package of claim 1, wherein the supporting member surrounds the second semiconductor chip on at least three sides thereof.

9. The semiconductor package of claim 1, wherein the supporting member receives power from the second semiconductor chip and is grounded through the second semiconductor chip.

10. The semiconductor package of claim 1, wherein the supporting member receives power from the second semiconductor chip, and is grounded through the package substrate.

11. The semiconductor package of claim 1, wherein the passive element includes a planar capacitor structure having a first electrode, a dielectric layer, and a second electrode, and wherein the first electrode, the dielectric layer, and the second electrode are vertically aligned.

12. The semiconductor package of claim 1, wherein the passive element includes a finger-shape capacitor structure having a first electrode, a dielectric layer, and a second electrode, and wherein the first electrode, the dielectric layer, and the second electrode are laterally aligned.

13. The semiconductor package of claim 1, wherein the passive element includes a finger-shape capacitor structure having a first electrode, a dielectric layer, and a second electrode, and wherein the first electrode, the dielectric layer, and the second electrode are vertically aligned.

14. The semiconductor package of claim 1, wherein the passive element includes at least one selected from the group consisting of a capacitor, an inductor, and a resistor.

15. A semiconductor package comprising
a package substrate;
a plurality of first semiconductor chips stacked on the package substrate, the first semiconductor chips stacked on each other;
a supporting member between the package substrate and a lowermost semiconductor chip among the first semiconductor chips or between vertically adjacent semiconductor chips among the first semiconductor chips, the supporting member configured to support at least one of the first semiconductor chips and including a passive element; and a second semiconductor chip at a same level with the supporting member.

16. The semiconductor package of claim 15, wherein the passive element includes at least one of a capacitor, inductor, and a resistor.

17. The semiconductor package of claim 15, wherein the package substrate has a recess to accommodate the supporting member therein.

18. The semiconductor package of claim 15, wherein a footprint defined by the supporting member is within a footprint defined by the at least one first semiconductor chip.

19. The semiconductor package of claim 15, wherein a footprint defined by both the supporting member and the second semiconductor chip is within a footprint defined by the at least one first semiconductor chip.

20. The semiconductor package of claim 1, further comprising:

another passive device separated from the supporting member.

* * * * *